US012607789B2

(12) United States Patent
Chung et al.

(10) Patent No.: US 12,607,789 B2
(45) Date of Patent: Apr. 21, 2026

(54) DISPLAY PANEL AND METHOD OF MANUFACTURING THE SAME AND ELECTRONIC DEVICE

(71) Applicant: Samsung Electronics Co., Ltd., Suwon-si (KR)

(72) Inventors: Deukseok Chung, Yongin-si (KR); Shin Ae Jun, Seongnam-si (KR); Tae Gon Kim, Hwaseong-si (KR); Shang Hyeun Park, Yongin-si (KR); Min Jong Bae, Yongin-si (KR); A Ra Jo, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 969 days.

(21) Appl. No.: 17/839,771

(22) Filed: Jun. 14, 2022

(65) Prior Publication Data

US 2023/0078393 A1 Mar. 16, 2023

(30) Foreign Application Priority Data

Aug. 31, 2021 (KR) ........................ 10-2021-0115695

(51) Int. Cl.
*G02B 5/20* (2006.01)
*B82Y 20/00* (2011.01)
(Continued)

(52) U.S. Cl.
CPC .............. *G02B 5/206* (2013.01); *C09K 11/06* (2013.01); *G02B 1/04* (2013.01); *H10K 50/115* (2023.02);
(Continued)

(58) Field of Classification Search
None
See application file for complete search history.

(56) References Cited

U.S. PATENT DOCUMENTS 6,582,862 B1 6/2003 Nakamura et al.
9,153,613 B2 10/2015 Kim
(Continued)

FOREIGN PATENT DOCUMENTS

JP 2007078805 A 3/2007
KR 20030039713 A 5/2003
(Continued)

OTHER PUBLICATIONS

Office Action dated Jan. 9, 2024 of the corresponding Korean Patent Application No. 10-2021-0115695.
(Continued)

*Primary Examiner* — Richard H Kim
(74) *Attorney, Agent, or Firm* — CANTOR COLBURN LLP

(57) ABSTRACT

A display panel, a method of manufacturing the same, and an electronic device including the display panel. The display panel includes a light emitting device array including a plurality of light emitting devices, a color conversion layer disposed on the light emitting device array and converting the emission spectrum of light emitted from the light emitting device array, and an encapsulation film on the color conversion layer, wherein the color conversion layer includes a quantum dot-polymer pattern including a quantum dot-polymer composite, an average roughness ($R_a$) of an upper surface of the quantum dot-polymer pattern is less than or equal to about 3% of a thickness of the encapsulation film.

23 Claims, 7 Drawing Sheets

(51) Int. Cl.

| | |
|---|---|
| ***B82Y 30/00*** | (2011.01) |
| ***C09K 11/06*** | (2006.01) |
| ***G02B 1/04*** | (2006.01) |
| ***H10K 50/115*** | (2023.01) |
| ***H10K 50/844*** | (2023.01) |
| ***H10K 59/38*** | (2023.01) |
| ***H10K 71/00*** | (2023.01) |

(52) U.S. Cl.

CPC ........... *H10K 50/844* (2023.02); *H10K 59/38* (2023.02); *H10K 71/00* (2023.02); *B82Y 20/00* (2013.01); *B82Y 30/00* (2013.01); *G02B 2207/101* (2013.01)

(56) References Cited

U.S. PATENT DOCUMENTS

| | | | | |
|---|---|---|---|---|
| 9,443,901 | B2 | 9/2016 | Kim | |
| 10,199,593 | B2 | 2/2019 | Byun et al. | |
| 10,971,691 | B2 | 4/2021 | Byun et al. | |
| 11,099,410 | B2 | 8/2021 | Chung et al. | |
| 2018/0237690 | A1 | 8/2018 | Chung et al. | |
| 2019/0276734 | A1* | 9/2019 | Kim | H10K 50/15 |
| 2020/0231871 | A1 | 7/2020 | Kim et al. | |
| 2020/0369955 | A1 | 11/2020 | Park et al. | |
| 2021/0036060 | A1* | 2/2021 | Cho | H10K 39/34 |
| 2021/0382331 | A1 | 12/2021 | Chung et al. | |
| 2022/0056334 | A1* | 2/2022 | Lee | C08F 222/102 |
| 2022/0181589 | A1* | 6/2022 | Lim | H10K 85/40 |

FOREIGN PATENT DOCUMENTS

| | | | |
|---|---|---|---|
| KR | 100414478 | B1 | 1/2004 |
| KR | 100579175 | B1 | 5/2006 |
| KR | 20130123042 | A | 11/2013 |
| KR | 20160035515 | A | 3/2016 |
| KR | 20160117063 | A | 10/2016 |
| KR | 20180073502 | A | 7/2018 |
| KR | 20180093149 | A | 8/2018 |
| KR | 102097440 | B1 | 4/2020 |
| KR | 102111438 | B1 | 5/2020 |
| KR | 20200090493 | A | 7/2020 |
| KR | 20200135688 | A | 12/2020 |
| KR | 20200145391 | A | 12/2020 |

OTHER PUBLICATIONS

English Translation of Office Action dated Sep. 11, 2024, of the corresponding Korean Patent Application No. 10-2021-0115695, 14 pp.

Office Action dated Sep. 11, 2024, of the corresponding Korean Patent Application No. 10-2021-0115695, 11 pp.

* cited by examiner

DISPLAY PANEL AND METHOD OF MANUFACTURING THE SAME AND ELECTRONIC DEVICE

CROSS-REFERENCE TO RELATED APPLICATION

This application claims priority to and the benefit of Korean Patent Application No. 10-2021-0115695 filed in the Korean Intellectual Property Office on Aug. 31, 2021, and all the benefits accruing therefrom under 35 U.S.C. § 119, the content of which in its entirety is herein incorporated by reference.

BACKGROUND

1. Field

A display panel, a method of manufacturing the same, and an electronic device are disclosed.

2. Description of the Related Art

Electronic devices may include a display panel such as a liquid crystal display panel or an organic light emitting diode panel. Display panels may include semiconductor nanocrystals called quantum dots.

SUMMARY

An embodiment provides a display panel capable of improving reliability in a display panel including quantum dots.

An embodiment provides a method of manufacturing the display panel.

An embodiment provides an electronic device including the display panel.

According to an embodiment, a display panel includes a light emitting device array including a plurality of light emitting devices, a color conversion layer disposed on the light emitting device array and configured to convert the emission spectrum of light emitted from the light emitting device array, and an encapsulation film on the color conversion layer, wherein the color conversion layer includes a quantum dot-polymer pattern including a quantum dot-polymer composite, and an average roughness ($R_a$) of an upper surface of the quantum dot-polymer pattern is less than or equal to about 3% of a thickness of the encapsulation film.

A thickness of the quantum dot-polymer pattern may be about 10 times to about 1,000 times a thickness of the encapsulation film, and the average roughness of the upper surface of the quantum dot-polymer pattern may be less than about 0.5% of the thickness of the quantum dot-polymer pattern.

The color conversion layer may further include partition walls defining a plurality of regions and surrounding each quantum dot-polymer pattern in each region, wherein the encapsulation film may be in contact with an upper surface of the quantum dot-polymer pattern and an upper surface of the partition wall.

The upper surface of the quantum dot-polymer pattern may be flat.

The quantum dot-polymer pattern may include an edge portion in contact with the partition wall, and a central portion surrounded by an edge portion of the quantum dot-polymer pattern, wherein a difference between a thickness of the edge portion of the quantum dot-polymer pattern and a thickness of the central portion of the quantum dot-polymer pattern may be less than about 1% of the thickness of the edge portion of the quantum dot-polymer pattern.

A maximum profile peak height ($R_p$) of the roughness profile of the upper surface of the quantum dot-polymer pattern may be less than the thickness of the encapsulation film.

The maximum profile peak height ($R_p$) of the roughness profile of the upper surface of the quantum dot-polymer pattern may be about 0.1% to about 50% of the thickness of the encapsulation film.

The maximum profile peak height ($R_p$) of the roughness profile of the upper surface of the quantum dot-polymer pattern may be about 2 nanometers (nm) to about 200 nm.

In an embodiment, the quantum dot-polymer pattern may not include a solvent.

A thermogravimetric analysis (TGA) graph measured by differential scanning calorimetry (DSC) of the quantum dot-polymer pattern may include a first peak between about 350° C. and about 450° C. and a second peak between about 200° C. and about 300° C., and the intensity of the first peak may be about 8 times to about 20 times the intensity of the second peak.

The average roughness of the upper surface of the quantum dot-polymer pattern may be about 1 nm to about 12 nm.

A maximum profile peak height ($R_p$) and a maximum profile valley depth ($R_v$) of the roughness profile of the upper surface of the quantum dot-polymer pattern may be about 2 nm to about 200 nm, respectively.

The light emitting device may be configured to emit light of a first emission spectrum, the color conversion layer includes a first color conversion region configured to convert light of the first emission spectrum into light of a second emission spectrum, a second color conversion region configured to convert light of the first emission spectrum into light of a third emission spectrum, and a light-transmitting region configured to transmit light of the first emission spectrum, wherein the quantum dot-polymer pattern in the first color conversion region may include first quantum dots configured to emit light of the second emission spectrum, the quantum dot-polymer pattern in the second color conversion region may include a second quantum dot configured to emit light of the third emission spectrum, the first emission spectrum, the second emission spectrum, and the third emission spectrum may be different from each other, and the second emission spectrum and the third emission spectrum may each include a longer wavelength than the first emission spectrum.

The light emitting device may include an organic light emitting diode, an inorganic light emitting diode, a quantum dot light emitting diode, a perovskite light emitting diode, a micro light emitting diode, a nano light emitting diode, or a combination thereof.

The encapsulation film may include an inorganic material, an organic-inorganic material, or a combination thereof, and an organic film between the color conversion layer and the encapsulation film may not be present.

The display panel may further include a color filter layer disposed on the encapsulation film.

According to an embodiment, an electronic device including the display panel is provided.

According to an embodiment, a method of manufacturing a display panel includes forming a color conversion layer on a light emitting device array including a plurality of light emitting devices, and forming an encapsulation film on the color conversion layer, wherein the forming of the color conversion layer includes forming a partition wall configured to define a plurality of regions, and forming a quantum dot-polymer pattern including a quantum dot-polymer composite in at least a portion of the plurality of regions to manufacture the display panel, wherein an average roughness of the upper surface of the polymer pattern may be less than or equal to about 3% of the thickness of the encapsulation film.

The forming of the quantum dot-polymer pattern includes preparing a solvent-free curable composition including quantum dots and a curable monomer, applying the solvent-free curable composition to the plurality of regions, and exposing the solvent-free curable composition applied to the plurality of regions to light to form the quantum dot-polymer pattern including the quantum dot-polymer composite in some of the plurality of regions.

The quantum dots may include two or more types of organic ligands that are thermally decomposable at different temperatures.

The organic ligand may include a first organic ligand in which a moiety bonding to the surface of the quantum dot is a carboxyl group, and a second organic ligand in which a moiety bonding to the surface of the quantum dot is a thiol group.

A thermogravimetric analysis (TGA) graph measured by differential scanning calorimetry (DSC) of the quantum dots may include a first peak between about 400° C. and about 500° C. and a second peak between 200° C. and about 300° C., and an area of the first peak may be about 0.16 times to about 0.5 times the area of the second peak.

The forming of the quantum dot-polymer pattern may include preparing a composition including quantum dots, a curable monomer, and a solvent, applying the composition to the plurality of regions, removing the solvent in the applied composition applied to the plurality of regions under vacuum, heat-treating the composition applied to the plurality of regions, and exposing the composition applied to the plurality of regions to light to form the quantum dot-polymer pattern disposed in some of the plurality of regions and including a quantum dot-polymer composite.

Reliability of a display panel including quantum dots may be improved.

BRIEF DESCRIPTION OF THE DRAWINGS

The above and other advantages and features of this disclosure will become more apparent by describing in further detail exemplary embodiments thereof with reference to the accompanying drawings, in which.

DETAILED DESCRIPTION

Figure 1:
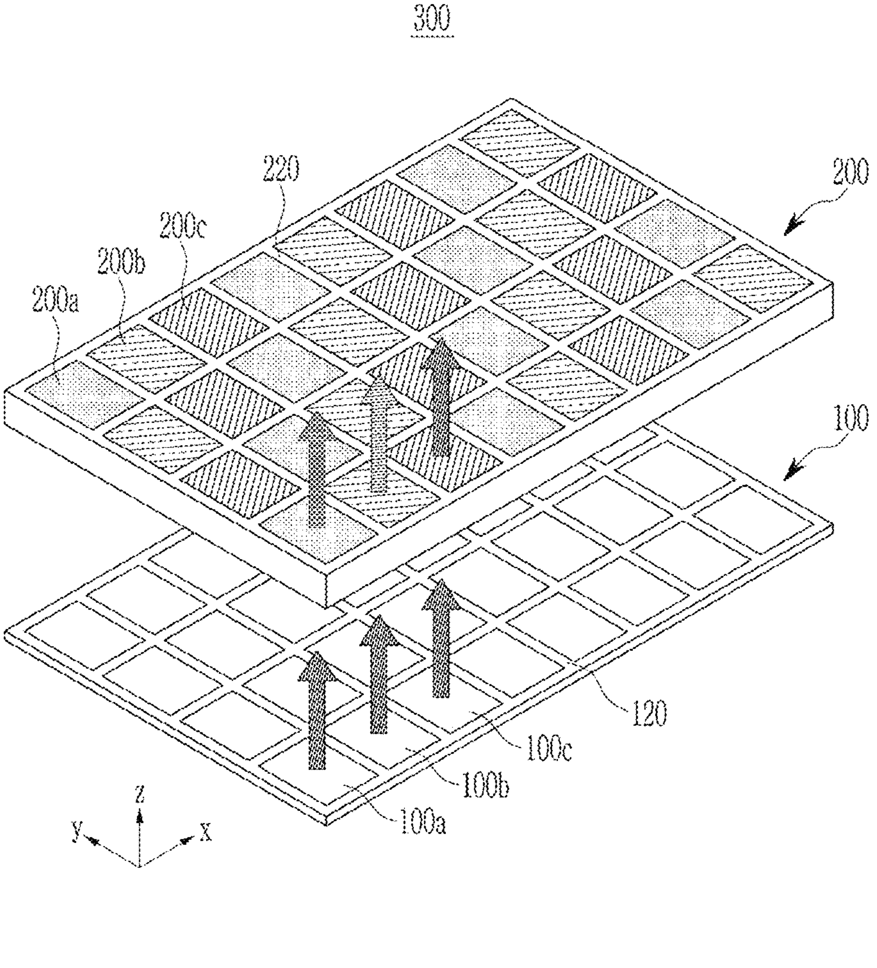
FIG. 1 is a perspective view schematically showing an example of a display panel according to an embodiment.

Hereinafter, example embodiments of the present disclosure will be described in detail so that a person skilled in the art would understand the same. However, this disclosure may be embodied in many different forms and is not to be construed as limited to the embodiments set forth herein.

In the drawings, the thickness of layers, films, panels, regions, etc., are exaggerated for clarity. It will be understood that when an element such as a layer, film, region, or substrate is referred to as being "on" another element, it may be directly on the other element or intervening elements may also be present. In contrast, when an element is referred to as being "directly on" another element, there are no intervening elements present.

In the drawings, parts having no relationship with the description are omitted for clarity, and the same or similar constituent elements are indicated by the same reference numeral throughout the specification.

It will be understood that, although the terms "first," "second," "third," etc., may be used herein to describe various elements, components, regions, layers, and/or sections, these elements, components, regions, layers and/or sections should not be limited by these terms. These terms are only used to distinguish one element, component, region, layer, or section from another element, component, region, layer, or section. Thus, "a first element," "component," "region," "layer," or "section" discussed below could be termed a second element, component, region, layer, or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, as used herein, "substituted" refers to replacement of hydrogen of a compound or a functional group by a halogen, a hydroxy group, a nitro group, a cyano group, an amino group, an azido group, an amidino group, a hydrazino group, a hydrazono group, a carbonyl group, a carbamyl group, a thiol group, an ester group, a carboxyl group or a salt thereof, a sulfonic acid group or a salt thereof, a phosphoric acid or a salt thereof, a C1 to C30 alkyl group, a C2 to C30 alkenyl group, a C2 to C30 alkynyl group, a C6 to C30 aryl group, a C7 to C30 arylalkyl group, a C1 to C30 alkoxy group, a C1 to C20 heteroalkyl group, a C3 to C20 heterocyclic group, a C3 to C20 heteroarylalkyl group, a C3 to C30 cycloalkyl group, a C3 to C15 cycloalkenyl group, a C6 to C15 cycloalkynyl group, a C3 to C30 heterocycloalkyl group, or a combination thereof. Herein, "hetero" refers to inclusion of 1 to 4 heteroatoms that may be N, O, S, Se, Te, Si, P, or a combination thereof.

Hereinafter, "lower portion" and "upper portion" are for convenience of description and do not limit the positional relationship.

Hereinafter, "combination" includes a mixture and a stacked structure of two or more.

Hereinafter, a display panel according to an embodiment is described.

Figure 2:
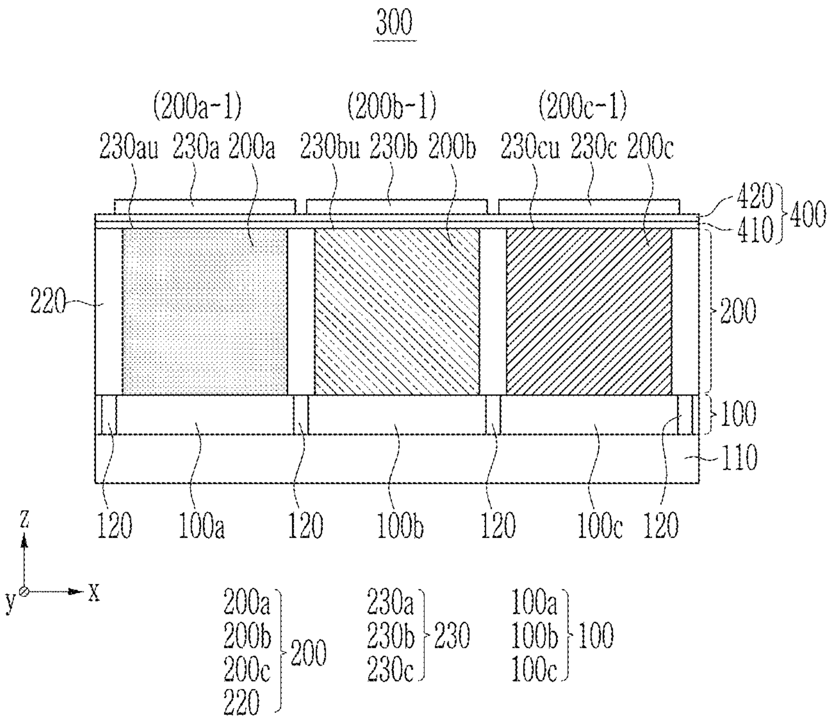
FIG. 2 is a cross-sectional view illustrating one pixel in the display panel of FIG. 1.

FIG. 1 is a perspective view schematically showing an example of a display panel according to an embodiment, and FIG. 2 is a cross-sectional view illustrating one pixel in the display panel of FIG. 1.

Referring to FIG. 1, a display panel 300 according to an embodiment includes a light emitting device array 100 and a color conversion layer 200 for converting an emission spectrum of light emitted from the light emitting device array 100 as main constituent elements.

The light emitting device array 100 includes a plurality of light emitting devices 100*a*, 100*b*, and 100*c* configured to emit light of a predetermined emission spectrum (hereinafter, referred to as a "first emission spectrum"), and the plurality of light emitting devices 100*a*, 100*b*, and 100*c* may be, for example, arranged along rows, columns, or a combination thereof.

The color conversion layer 200 is disposed on the light emitting device array 100 in a direction through which the light emitted from the light emitting device array 100 (e.g., on the upper portion of the light emitting device array 100) passes, e.g., in a direction that the light passing through the light emitting device array 100 is emitted, and the light of the first emission spectrum emitted from the light emitting device array 100 may be converted into light of a second or third emission spectrum different from the first emission spectrum and thus emitted toward an observer (e.g., toward the upper portion of the color conversion layer 200). The first, second, and third emission spectra may be different from each other, and the second and third emission spectra may have a longer wavelength spectra, e.g., may include a longer wavelength, than the first emission spectrum. For example, the first, second, and third emission spectra may belong to a visible light wavelength spectrum.

The color conversion layer 200 includes a first color conversion region 200*a* configured to convert the light of the first emission spectrum into the light of the second emission spectrum and thus emit the light of the second emission spectrum, a second color conversion region 200*b* configured to convert the light of the first emission spectrum into the light of the third emission spectrum and thus emit the light of the third emission spectrum, and a light-transmitting region 200*c* configured to transmit the light of the first emission spectrum.

The first color conversion region 200*a*, the second color conversion region 200*b*, and the light-transmitting region 200*c* may form a unit group and be repeatedly arranged along rows, columns, or a combination thereof, e.g., multiple unit groups may be arranged along rows, columns, or a combination thereof. The first color conversion region 200*a*, the second color conversion region 200*b*, and the light-transmitting region 200*c* may each constitute subpixels of the display panel 300, and the unit group of the first color conversion region 200*a*, the second color conversion region 200*b*, and the light-transmitting region 200*c* may constitute one pixel. However, the present disclosure is not limited thereto, and each pixel may include two or more of the first color conversion region 200*a*, the second color conversion region 200*b*, the light-transmitting region 200*c*, or a combination thereof and further include an additional subpixel such as a white subpixel. The plurality of pixels may be, for example, a Bayer matrix, a PenTile matrix, a diamond matrix, or a combination thereof, but is not limited thereto.

Each subpixel may display three primary colors or a combination of the three primary colors and be configured to emit light of an emission spectrum of its corresponding color. For example, each subpixel may display red, green, blue, or a combination thereof, for example, when the first emission spectrum is a blue emission spectrum, the second emission spectrum is a red emission spectrum, and the third emission spectrum is a green emission spectrum, the first color conversion region 200*a* may be a red subpixel emitting red light and display red, the second color conversion region 200*b* may be a green subpixel emitting green light and displaying green, and the light-transmitting region 200*c* may be a blue subpixel emitting blue light and displaying blue.

In the drawing, the first color conversion region 200*a*, the second color conversion region 200*b*, and the light-transmitting region 200*c* are illustrated to have an equal size but are not limited thereto, and the first color conversion region 200*a*, the second color conversion region 200*b*, the light-transmitting region 200*c*, or a combination thereof may be larger or smaller than the others. In the drawing, the first color conversion region 200*a*, the second color conversion region 200*b*, and the light-transmitting region 200*c* are illustrated to have an equal shape but not limited thereto, and the first color conversion region 200*a*, the second color conversion region 200*b*, the light-transmitting region 200*c*, or a combination thereof may have a different shape from the others.

Referring to FIG. 2, the display panel 300 includes a substrate 110, a light emitting device array 100, a color conversion layer 200, an encapsulation film 400, and a color filter layer 230.

The substrate 110 may be, for example, a thin film transistor substrate (TFT substrate) called a backplane or a complementary metal-oxide semiconductor (CMOS) substrate.

The TFT substrate includes a substrate (not shown) and a pixel circuit (not shown). The substrate may be for example a glass substrate or a polymer substrate. The polymer substrate may include, for example, polyimide, polyamide, polyamideimide, polyethylene terephthalate, polyethylene naphthalene, polymethyl methacrylate, polycarbonate, a copolymer thereof, or a combination thereof, but is not limited thereto. The pixel circuit may be repeatedly arranged on the substrate, e.g., multiple pixel circuits may be arranged on the substrate, and may be arranged for each subpixel. Each pixel circuit may include a thin film transistor (TFT), e.g., one or more thin film transistors (TFTs), and capacitors to independently control each subpixel, drive each subpixel, or a combination thereof. The TFT in each subpixel may independently operate each of the light emitting devices 100*a*, 100*b*, and 100*c*, which will be described herein. The plurality of TFTs may be connected to a signal line, and the signal line may include a gate line transmitting a gate signal (or a scan signal), a data line transmitting a data signal, a driving voltage line transmitting a driving voltage, or a combination thereof. The plurality of TFTs may include a, e.g., at least one, switching TFT and a, e.g., at least one, driving TFT.

The CMOS substrate may be a substrate for driving CMOS, and for example, a pixel circuit disposed for each subpixel may be integrated in a semiconductor substrate such as a silicon substrate.

The light emitting device array 100 may be disposed on the substrate 110 and may include a plurality of light emitting devices 100*a*, 100*b*, and 100*c* arranged in rows, columns, or a combination thereof. Each of the light emitting devices 100*a*, 100*b*, and 100*c* may be disposed in each subpixel and may be independently operated by a pixel circuit of each subpixel.

The plurality of light emitting devices 100*a*, 100*b*, and 100*c* may be configured to emit light of the same or different emission spectrum and the plurality of light emitting devices 100*a*, 100*b*, and 100*c* may be configured to, for example, emit light of the same emission spectrum. Each of the light emitting devices 100*a*, 100*b*, and 100*c* may be configured to emit light of a first emission spectrum as described herein, and the first emission spectrum may have a shorter wavelength spectrum than the second and third emission spectra to be described herein, and for example, the first emission spectrum may be a blue emission spectrum. The maximum emission wavelength of the blue emission spectrum may belong to greater than or equal to about 380 nm and less than about 500 nm.

For example, each of the light emitting devices 100*a*, 100*b*, and 100*c* may be a light emitting diode (LED), and may include a pair of electrodes and a light emitting layer between the pair of electrodes. The light emitting layer may include a light emitter configured to emit light of the first emission spectrum, and the light emitter may include an organic light emitter, an inorganic light emitter, an organic-inorganic light emitter, or a combination thereof. The light emitter may be one type or two or more types. For example, the light emitting layer may include a light emitter configured to emit blue light, and each of the light emitting devices 100*a*, 100*b*, and 100*c* may be a blue light emitting diode.

Each of the light emitting devices 100*a*, 100*b*, and 100*c* may be, for example, an organic light emitting diode, an inorganic light emitting diode, a quantum dot light emitting diode, a perovskite light emitting diode, a micro light emitting diode, a nano light emitting diode, or a combination thereof, depending on the material of the light emitting layer, the size of the light emitting diode, or a combination thereof.

For example, the light emitting layer may include a low molecular weight compound, a polymer, or a combination thereof as a light emitter, and each of the light emitting devices 100*a*, 100*b*, and 100*c* may be an organic light emitting diode.

For example, the light emitting layer may include an inorganic semiconductor such as GaN, InGaN, or AlGaN; quantum dots such as Zn—Te—Se, InP, or InZnP; perovskite such as $CsPbX_3$, $CH_3NH_3PbX_3$, $CH_3NH_3SnX_3$, wherein X is $F^-$, $Cl^-$, $Br^-$, $I^-$, or a combination thereof; or a combination thereof as a light emitter, and each of the light emitting devices 100*a*, 100*b*, and 100*c* may be a quantum dot light emitting diode, a perovskite light emitting diode, a micro light emitting diode, or a nano light emitting diode.

Each of the light emitting devices 100*a*, 100*b*, and 100*c* may be equal or different and surrounded with a pixel definition layer 120 partitioning each region of the light emitting device array 100.

The color conversion layer 200 may be configured to absorb the light of the first emission spectrum emitted from the light emitting devices 100*a*, 100*b*, and 100*c* of the light emitting device array 100 and emit light of the second and third emission spectra different from the first emission spectrum. The second and third emission spectra may be longer spectrum than the first emission spectrum, for example, the first, second and third emission spectra may each belong to a visible light wavelength spectrum, for example, the first emission spectrum may be a blue emission spectrum, the second emission spectrum may be a red emission spectrum, and the third emission spectrum may be a green emission spectrum. The red emission spectrum may have a maximum emission wavelength belonging to greater than about 600 nm and about 750 nm, the green emission spectrum may have a maximum emission wavelength belonging to about 500 nm to about 600 nm.

The color conversion layer 200 includes a plurality of the first color conversion regions 200*a*, a plurality of the second color conversion regions 200*b*, a plurality of the light-transmitting regions 200*c*, and a partition wall 220 defining each region. The first color conversion region 200*a*, the second color conversion region 200*b*, and the light-transmitting region 200*c* may be overlapped with each of the light emitting devices 100*a*, 100*b*, and 100*c* along a thickness direction (e.g., z direction) of the substrate 110, and the partition wall 220 may overlap the pixel definition layer 120.

The first color conversion region 200*a*, the second color conversion region 200*b*, and the light-transmitting region 200*c* may be configured to respectively emit light of a different emission spectrum from one another and thus display a different color from one another. The first color conversion region 200*a* may be configured to convert the light of the first emission spectrum (e.g., blue light) emitted from the light emitting device 100*a* and convert the light of the first emission spectrum into light of a second emission spectrum (e.g., red light) and display a color (e.g., red) corresponding to the second emission spectrum. The second color conversion region 200*b* may be configured to convert the light of the first emission spectrum (e.g., blue light) emitted from the light emitting device 100*b* into light of a third emission spectrum (e.g., green light) and display a color (e.g., green) corresponding to the third emission spectrum. The light-transmitting region 200*c* may be configured to transmit light of the first emission spectrum (e.g., blue light) emitted from the light emitting device 100*b* as is and display a color (e.g., blue) corresponding to the first emission spectrum.

The partition wall 220 may be formed in, for example, a grid pattern to define each of regions of the color conversion layer 200. The partition wall 220 may be disposed between the first color conversion region 200*a* and the second color conversion region 200*b*, between the second color conversion region 200*b* and the light-transmitting region 200*c*, and between the light-transmitting region 200*c* and the first color conversion region 200*a*, and each of the first color conversion region 200*a*, the second color conversion region 200*b*, and the light-transmitting region 200*c* may be surrounded by the partition wall 220.

The partition wall 220 may include an inorganic material, an organic material, an organic-inorganic material, or a combination thereof, and may include, for example, an oxide, a nitride, or an oxynitride, for example, silicon oxide, silicon nitride, silicon oxynitride, or a combination thereof, but is not limited thereto.

The color conversion layer 200 may include a quantum dot-polymer composite. The quantum dot-polymer composite may be a composite in which a plurality of quantum dots is dispersed in a polymer matrix. The quantum dot-polymer composite may provide the aforementioned color conversion by shifting the emission spectrum by the photoluminescence characteristic of the quantum dots.

Each of the first color conversion region 200*a* and the second color conversion region 200*b* of the color conversion layer 200 may include patterns 200*a*-1 and 200*b*-1 including each quantum dot-polymer composite (hereinafter referred to as a "quantum dot-polymer pattern") and the light-transmitting region 200*c* may include a pattern 200*c*-1 (hereinafter referred to as a "polymer pattern") including a polymer.

The quantum dot-polymer patterns 200*a*-1 and 200*b*-1 may be formed, by applying a curable composition for a quantum dot-polymer composite to a region surrounded with the partition wall 220 and performing, for example, photolithography or a solution process. Accordingly, the quantum dot-polymer patterns 200*a*-1 and 200*b*-1 may respectively fill the first color conversion region 200*a* and the second color conversion region 200*b* and have a substantially equivalent shape to those of the first color conversion region 200*a* and the second color conversion region 200*b*. The quantum dot-polymer patterns 200*a*-1 and 200*b*-1 may be surrounded with the partition wall 220.

Similarly, the polymer pattern 200*c*-1 may be formed by applying a curable composition for a polymer to a region surrounded with the partition wall 220 and performing, for example, photolithography or a solution process. Accordingly, the polymer pattern 200*c*-1 may fill the light-transmitting region 200*c* and have a substantially equivalent shape to that of the light-transmitting region 200*c*. The polymer pattern 200*c*-1 may be surrounded with the partition wall 220.

The quantum dot-polymer pattern 200*a*-1 of the first color conversion region 200*a* includes a polymer matrix and a plurality of first quantum dots dispersed in the polymer matrix, and the quantum dot-polymer pattern 200*b*-1 of the second color conversion region 200*b* includes another polymer matrix and a plurality of second quantum dots dispersed in the polymer matrix. The quantum dot-polymer patterns 200*a*-1 and 200*b*-1 may further include scattering particles.

The polymer matrix may be a dispersion medium for dispersing the first quantum dots, the second quantum dots, the scattering particles, or a combination thereof, and may be, for example, a light-transmitting resin. The polymer matrix may include a crosslinked polymer, a linear polymer, or a combination thereof. The crosslinked polymer may be, for example, a cured product by polymerization of a thermosetting monomer or polymerization of a photocurable monomer, for example, a cured product of monomers having a, e.g., at least one, unsaturated double bond, for example, a cured product of multi-functional monomers having two or more functional groups.

The crosslinked polymer may be, for example, a thiolene resin, a crosslinked poly(meth)acrylate, a crosslinked polyurethane, a crosslinked epoxy resin, a crosslinked vinyl monomer, a crosslinked silicone resin, a crosslinked cardo-based resin, a crosslinked imide resin, or a combination thereof. The crosslinked polymer may be, for example, a cured product of a (meth)acrylate compound, an oxetane compound, a thiol group-containing compound, or a combination thereof, and may be a cured product of ethylene glycol di(meth)acrylate, diethylene glycol di(meth)acrylate, triethylene glycol di(meth)acrylate, propylene glycol di(meth)acrylate, neopentyl glycol di(meth)acrylate, 1,4-butanediol di(meth)acrylate, 1,6-hexanediol di(meth)acrylate, bisphenol A di(meth)acrylate, pentaerythritol di(meth)acrylate, pentaerythritol tri(meth)acrylate, pentaerythritol tetra(meth)acrylate, pentaerythritol hexa(meth)acrylate, dipentaerythritol di(meth)acrylate, dipentaerythritol tri(meth)acrylate, dipentaerythritol penta(meth)acrylate, dipentaerythritol hexa(meth)acrylate, bisphenol A epoxy(meth)acrylate, ethylene glycol monomethyl ether (meth)acrylate, trimethylolpropane tri(meth)acrylate, tris(meth)acryloyloxyethyl phosphate, novolac epoxy(meth)acrylate, or a combination thereof.

The linear polymer may include, for example, a carboxylic acid-containing repeating unit, and the carboxylic acid-containing repeating unit may be a cured product of monomers including a carboxyl group and a carbon-carbon double bond, a monomer having a dianhydride moiety, or a combination thereof.

The first quantum dots and the second quantum dots may be crystalline semiconductors having a nano-level particle size. The first quantum dots may have photoluminescence characteristics of absorbing the light of the first emission spectrum (e.g., blue light) emitted from the light emitting device 100*a* and emitting the light of the second emission spectrum (e.g., red light), and the second quantum dots may have photoluminescence characteristics of absorbing the light of the first emission spectrum (e.g., blue light) emitted from the light emitting device 100*b* and emitting the light of the third emission spectrum (e.g., green light). The first quantum dots and the second quantum dots have isotropic light emission characteristics and thus may be configured to emit light in all directions and exhibit an improved wide viewing angle.

An energy bandgap of the first quantum dot and the second quantum dot may be adjusted according to sizes, compositions, or a combination thereof, and the emission wavelength may be adjusted accordingly. For example, the larger the size of the quantum dot, the narrower the energy bandgap may be, and accordingly, light of a relatively long wavelength spectrum may be emitted and as the size of the quantum dot decreases, the quantum dot may have a wider energy bandgap, and thus may be configured to emit light of a relatively short wavelength spectrum. For example, the first quantum dot and the second quantum dot may have a diameter belonging to about 1 nm to about 10 nm depending on the emission wavelength.

The first quantum dot and the second quantum dot may have a relatively narrow full width at half maximum (FWHM). Herein, the FWHM may be a width of a wavelength corresponding to a half of a peak absorption point and as the FWHM is narrower, light in a narrower wavelength spectrum may be emitted and high color purity may be obtained. The first quantum dot and the second quantum dot may have for example a FWHM of less than or equal to about 50 nm, within the range, less than or equal to about 45 nm, less than or equal to about 40 nm, less than or equal to about 35 nm, less than or equal to about 30 nm, or less than or equal to about 28 nm, within the range about 3 nm to about 50 nm, about 3 nm to about 45 nm, about 3 nm to about 40 nm, about 3 nm to about 35 nm, about 3 nm to about 30 nm, or about 3 nm to about 28 nm. As such, the first quantum dot and the second quantum dot have a relatively narrow FWHM, and good color purity and color reproducibility may be implemented.

The first quantum dot and the second quantum dot may each independently include a Group II-VI semiconductor compound, a Group III-V semiconductor compound, a Group III-VI semiconductor compound, a Group IV-VI semiconductor compound, a Group IV element or semiconductor compound, a Group I-III-VI semiconductor compound, a Group I-II-IV-VI semiconductor compound, a Group II-III-V semiconductor compound, or a combination thereof.

The Group II-VI semiconductor compounds may include, for example, a binary semiconductor compound such as CdS, CdSe, CdTe, ZnS, ZnSe, ZnTe, ZnO, HgS, HgSe, HgTe, MgSe, MgS, or a combination thereof; a ternary element compound such as CdSeS, CdSeTe, CdSTe, ZnSeS, ZnSeTe, ZnSTe, HgSeS, HgSeTe, HgSTe, HgZnS, HgZnSe, HgZnTe, MgZnSe, MgZnS, CdZnS, CdZnSe, CdZnTe, CdHgS, CdHgSe, CdHgTe, or a combination thereof; a quaternary element compound such as CdZnSeS, CdZnSeTe, CdZnSTe, CdHgSeS, CdHgSeTe, CdHgSTe, HgZnTeS, HgZnSeS, HgZnSeTe, HgZnSTe, or a combination thereof; or a combination thereof, but is not limited thereto.

The Group III-V semiconductor compound may include, for example, a binary semiconductor compound such as GaN, GaP, GaAs, GaSb, AlN, AlP, AlAs, AlSb, InN, InP, InAs, InSb, or a combination thereof; a ternary element compound such as GaNP, GaNAs, GaNSb, GaPAs, GaPSb, AlNP, AlNAs, AlNSb, AlPAs, AlPSb, InGaP, InNP, InAlP, InNAs, InNSb, InPAs, InPSb, or a combination thereof; a quaternary element compound such as GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, or a combination thereof; or a combination, but is not limited thereto. The Group III-V semiconductor compound may further include a Group II element. The Group III-V semiconductor compound further including a Group II element may include, for example, InZnP, InGaZnP, InAlZnP, or a combination thereof.

The Group III-VI semiconductor compound may include, for example, a binary semiconductor compound such as GaS, GaSe, $Ga_2Se_3$, GaTe, InS, InSe, In2Se3, InTe, or a combination thereof; a ternary element compound such as $nGaS_3$, $InGaSe_3$ or a combination thereof; or a combination thereof.

The Group IV-VI semiconductor compound may include, for example, a binary semiconductor compound such as SnS, SnSe, SnTe, PbS, PbSe, PbTe, or a combination thereof; a ternary element compound such as SnSeS, SnSeTe, SnSTe, PbSeS, PbSeTe, PbSTe, SnPbS, SnPbSe, SnPbTe, or a combination thereof; a quaternary element compound such as SnPbSSe, SnPbSeTe, SnPbSTe, or a combination thereof; or a combination, but is not limited thereto.

The Group IV element or semiconductor compound may include, for example, a single element such as Si, Ge, or a combination thereof; a binary semiconductor compound such as SiC, SiGe, or a combination thereof; or a combination of these, but is not limited thereto.

The Group I-III-VI semiconductor compound may be, for example, such as AgInS, $AgInS_2$, CuInS, $CuInS_2$, $CuInSe_2$, CuInGaSe, CuInGaS, $CuGaO_2$, $AgGaO_2$, $AgAlO_2$, or a combination thereof but is not limited thereto.

The Group I-II-IV-VI semiconductor compound may be, for example, CuZnSnSe, CuZnSnS, or a combination thereof, but is not limited thereto.

The Group II-III-V semiconductor compound may include, for example, InZnP, but is not limited thereto.

The first quantum dot and the second quantum dot may include the single element, the binary element compound, the ternary element compound, or the quaternary element compound in a substantially uniform concentration or partially different concentration distributions The first quantum dot and the second quantum dot may have a single structure or a core-shell structure in which the concentration of each element included in the corresponding quantum dot is uniform.

For example, the first quantum dot and the second quantum dot may have a core-shell structure. The shell may include, for example, a metal or non-metal oxide, a semiconductor compound, or a combination thereof. Examples of the metal or non-metal oxide may include a binary compound such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, NiO, or a combination thereof; a ternary compound such as $MgAl_2O_4$, $CoFe_2O_4$, $NiFe_2O_4$, $CoMn_2O_4$, or a combination thereof; or a combination thereof. Examples of the semiconductor compound may include the aforementioned Group II-VI semiconductor compound, Group III-V semiconductor compound, Group III-VI semiconductor compound, Group IV-VI semiconductor compound, Group IV element or semiconductor compound, Group I-III-VI semiconductor compound, Group I-II-IV-VI semiconductor compound, Group II-III-V semiconductor compound, or a combination thereof, for example, CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, or a combination thereof.

For example, the core-shell structure may have a concentration gradient in which the concentration of an element in the shell decreases toward the center. For example, a material composition constituting a shell may have a higher, e.g., wider or greater, energy bandgap than a material composition constituting a core, and thus, may have a quantum confinement effect. The first quantum dot and the second quantum dot may include one core and a multi-layered shell surrounding the core. In this case, the multi-layered shell has two or more shells, and each layer may independently have a single composition, an alloy, a concentration gradient, or a combination thereof. For example, among the multi-layered shells, a shell disposed farther from the core may have a higher, e.g., wider or greater, energy band gap than a shell disposed closer to the core, thereby having a quantum confinement effect.

For example, the first quantum dot and the second quantum dot may include a cadmium-free quantum dot. The cadmium-free quantum dot is a quantum dot that does not include cadmium (Cd). Cadmium (Cd) may cause severe environment/health problems and a restricted element by Restriction of Hazardous Substances Directive (RoHS) in a plurality of countries, and thus the non-cadmium-based quantum dot may be effectively used.

For example, the first quantum dot, the second quantum dot, or a combination thereof may be a semiconductor compound including indium (In) and zinc (Zn), phosphorus (P), or a combination thereof, and may be, for example, an In—P semiconductor compound, an In—Zn—P semiconductor compound, or a combination thereof. For example, the first quantum dot, the second quantum dot, or a combination thereof may be a semiconductor compound including zinc (Zn) and tellurium (Te), selenium (Se), or a combination thereof, and may include, for example, a Zn—Te semiconductor compound, Zn—Se semiconductor compound, a Zn—Te—Se semiconductor compound, or a combination thereof.

The scattering particles may be configured to scatter light emitted from the first quantum dot or the second quantum dot in the first or second color conversion region 200*a* and 200*b*, reflect light emitted from the first quantum dot or the second quantum dot in the first or second color conversion region 200*a* and 200*b*, or a combination thereof, and thus lead the scattered light, the reflected light, or a combination thereof to color filter layers 230*a* and 230*b*. The scattering particles, for example, may be configured to scatter light, reflect light, or a combination thereof in various directions regardless of the incident angle without substantially converting an emission wavelength of light emitted from the first quantum dot or the second quantum dot, and thus, side visibility of a display panel 300 may be improved.

The scattering particles may be low refractive index nanoparticles and for example, include a metal or semimetal oxide such as a silicon oxide, a titanium oxide, a zirconium oxide, an aluminum oxide, an indium oxide, a zinc oxide, a tin oxide, or a combination thereof, an organic material such as an acrylic resin, a urethane resin, or a combination thereof; or a combination thereof but is not limited thereto.

In an embodiment, the light-transmitting region 200*c* is configured to transmit light emitted from the light emitting device 100*c* as is and thus may not include quantum dots for converting an emission wavelength. However, the light-transmitting region 200*c* may include quantum dots configured to emit the light of the first emission spectrum (e.g., blue light). Accordingly, the light-transmitting region 200*c* may include a pattern (that may not include quantum dots) including a polymer 200*c*-1 (hereinafter, referred to as a "polymer pattern"). The polymer pattern 200*c*-1 may be formed by applying a curable composition to a region surrounded with the partition wall 220 and performing, for example, photolithography or a solution process. Accordingly, the polymer pattern 200*c*-1 may fill the light-transmitting region 200*c* and have a substantially equivalent shape to that of the light-transmitting region 200*c*. The polymer pattern 200*c*-1 may be surrounded with the partition wall 220. The polymer pattern 200*c*-1 may include a polymer matrix, and description of the polymer matrix is the same as described herein.

The polymer pattern 200*c*-1 of the light-transmitting region 200*c* may further include the disclosed scattering particles. The scattering particles may be configured to scatter light emitted from the light emitting device 100*c*, reflect light emitted from the light emitting device 100*c*, or a combination thereof and lead the scattered light, the reflected light, or a combination thereof to a color filter layer 230*c*, which will be described herein. The scattering particles, for example, may be configured to scatter light, reflect light, or a combination thereof in various directions regardless of its incident angle without substantially converting the emission wavelength of the light emitted from the light emitting device 100*c* and thereby, improve side visibility of the display panel 300. The scattering particles are the same as described herein.

On the other hand, each upper surface 200*au*, 200*bu*, and 200*cu* of the quantum dot-polymer patterns 200*a*-1 and 200*b*-1 and the polymer pattern 200*c*-1 may have a relatively high flatness. The flatness of the upper surfaces 200*au*, 200*bu*, and 200*cu* of the quantum dot-polymer patterns 200*a*-1 and 200*b*-1 and the polymer pattern 200*c*-1 may affect luminance of the display panel 300, for example, as the quantum dot-polymer patterns 200*a*-1 and 200*b*-1 and the polymer pattern 200*c*-1 have a higher, e.g., greater, flatness, light extraction efficiency may be higher, e.g., greater, without interfering with a path of light from the quantum dot-polymer patterns 200*a*-1 and 200*b*-1 and the polymer pattern 200*c*-1, realizing the display panel 300 with high luminance.

However, the quantum dot-polymer patterns 200*a*-1 and 200*b*-1 and the polymer pattern 200*c*-1, as described herein, may be respectively formed by applying a curable composition through photolithography or a solution process, and profiles of the patterns may be deformed by heat, light, or a combination thereof during the process, lowering the flatness, e.g., increasing the surface roughness.

An embodiment, as described herein, may improve, e.g., increase, the flatness of the upper surfaces 200*au*, 200*bu*, and 200*cu* of the quantum dot-polymer patterns 200*a*-1 and 200*b*-1 and the polymer pattern 200*c*-1 by adjusting a curable composition, a process used for the quantum dot-polymer patterns 200*a*-1 and 200*b*-1 and the polymer pattern 200*c*-1, or a combination thereof to reduce or prevent deformation of the pattern profiles.

For example, each of the upper surfaces 200*au*, 200*bu*, and 200*cu* of the quantum dots-polymer patterns 200*a*-1 and 200*b*-1 and the polymer pattern 200*c*-1 may have relatively low surface roughness, respectively. The surface roughness may indicate, for example, the surface flatness. As the surface roughness is lower, e.g., decreases, the degree of irregular irregularities on the surface is small, e.g., decreases, which may mean that the surface flatness is high.

For example, the surface roughness of the quantum dot-polymer patterns 200*a*-1 and 200*b*-1 and the polymer pattern 200*c*-1 may be evaluated as an average roughness ($R_a$). The average roughness ($R_a$) of the quantum dot-polymer patterns 200*a*-1 and 200*b*-1 and the polymer pattern 200*c*-1 may be less than about 0.5% of each thickness of the quantum dot-polymer patterns 200*a*-1 and 200*b*-1 and the polymer pattern 200*c*-1, within the disclosed range, less than or equal to about 0.4%, less than or equal to about 0.3%, less than or equal to about 0.2%, less than or equal to about 0.1%, or less than or equal to about 0.05%, and within the disclosed range, greater than about 0% and less than or equal to about 0.5%, greater than about 0% and less than or equal to 0.4%, greater than about 0% and less than or equal to about 0.3%, greater than about 0% and less than or equal to about 0.2%, greater than about 0% and less than or equal to about 0.1%, or greater than about 0% and less than or equal to about 0.05% of each thickness of the quantum dot-polymer patterns 200*a*-1 and 200*b*-1 and the polymer pattern 200*c*-1.

For example, each thickness of the quantum dot-polymer patterns 200*a*-1 and 200*b*-1 and the polymer pattern 200*c*-1 may be about 5 micrometers (μm) to about 20 μm and within the disclosed range, about 6 μm to about 18 μm, about 6 μm to about 15 μm or about 6 μm to about 12 μm. Each average roughness ($R_a$) of the upper surfaces 200*au*, 200*bu*, and 200*cu* of the quantum dot-polymer patterns 200*a*-1 and 200*b*-1 and the polymer pattern 200*c*-1 may be less than or equal to about 12 nm, less than or equal to about 11 nm, less than or equal to about 10 nm, less than or equal to about 9 nm, less than or equal to about 8 nm, less than or equal to about 7 nm, less than or equal to about 6 nm, or less than or equal to about 5 nm, and within the disclosed range, about 1 nm to about 12 nm, about 1 nm to about 11 nm, about 1 nm to about 10 nm, about 1 nm to about 9 nm, about 1 nm to about 8 nm, about 1 nm to about 7 nm, about 1 nm to about 6 nm, or about 1 nm to about 5 nm.

For example, each surface roughness of the quantum dot-polymer patterns 200*a*-1 and 200*b*-1 and the polymer pattern 200*c*-1 may be evaluated as a maximum profile peak height ($R_p$), a maximum profile valley depth ($R_v$), or a combination thereof of roughness profiles of the upper surfaces 200*au*, 200*bu*, and 200*cu* of the quantum dot-polymer patterns 200*a*-1 and 200*b*-1 and the polymer pattern 200*c*-1. The maximum profile peak height ($R_p$), the maximum profile valley depth ($R_v$), or a combination thereof of the quantum dot-polymer patterns 200*a*-1 and 200*b*-1 and the polymer pattern 200*c*-1 may be less than about 3% of each thickness of the quantum dot-polymer patterns 200*a*-1 and 200*b*-1 and the polymer pattern 200*c*-1, within the disclosed range, less than about 2.5%, less than or equal to about 2.0%, less than or equal to about 1.8%, less than or equal to about 1.7%, less than or equal to about 1.5%, less than or equal to about 1.4%, or less than or equal to about 1.2%, and within the disclosed range, greater than about 0% and less than about 3%, greater than about 0% and less than or equal to about 2.5 greater than about 0% and less than or equal to about 2.0%, greater than about 0% and less than or equal to about 1.8%, greater than about 0% and less than or equal to about 1.7%, greater than about 0% and less than or equal to about 1.5%, greater than about 0% and less than or equal to about 1.4%, or greater than about 0% and less than or equal to about 1.2% of each thickness of the quantum dot-polymer patterns 200*a*-1 and 200*b*-1 and the polymer pattern 200*c*-1.

For example, each thickness of the quantum dot-polymer patterns 200*a*-1 and 200*b*-1 and the polymer pattern 200*c*-1 may be about 5 μm to about 20 μm, within the disclosed range about 6 μm to about 18 μm, about 6 μm to about 15 μm or about 6 μm to about 12 μm. A maximum profile peak height ($R_p$), a maximum profile valley depth ($R_v$), or a combination thereof of the upper surfaces 200*au*, 200*bu*, and 200*cu* of the quantum dot-polymer patterns 200*a*-1 and 200*b*-1 and the polymer pattern 200*c*-1 may be less than or equal to about 200 nm, less than or equal to about 180 nm, less than or equal to about 170 nm, less than or equal to about 160 nm, less than or equal to about 150 nm, less than or equal to about 130 nm, less than or equal to about 120 nm, less than or equal to about 100 nm, less than or equal to about 80 nm, less than or equal to about 60 nm, or less than or equal to about 50 nm, and within the disclosed range about 2 nm to about 200 nm, about 2 nm to about 180 nm, about 2 nm to about 170 nm, about 2 nm to about 160 nm, about 2 nm to about 150 nm, about 2 nm to about 130 nm, about 2 nm to about 120 nm, about 2 nm to about 100 nm, about 2 nm to about 80 nm, about 2 nm to about 60 nm, or about 2 nm to about 50 nm.

For example, each of the quantum dot-polymer patterns 200*a*-1 and 200*b*-1 and the polymer pattern 200*c*-1 may have a uniform thickness without a thickness difference according to positions, and may be substantially flat. For example, each of the quantum dot-polymer patterns 200*a*-1 and 200*b*-1 and the polymer pattern 200*c*-1 may include an edge portion in contact with the partition wall 220 and a central portion surrounded by edge portions on all sides, wherein there may be substantially no difference between a thickness of the edge portion and a thickness of the central portion, and for example, the difference between the thickness at the edge portion and the thickness at the central portion may be less than about 1% of the thickness at the edge portion, and within the disclosed range, less than or equal to about 0.9%, less than or equal to about 0.8%, less than or equal to about 0.6%, less than or equal to about 0.5%, less than or equal to about 0.3%, less than or equal to about 0.2%, less than or equal to about 0.1%, or about zero of the thickness at the edge portion.

The encapsulation film 400 may be disposed on the color conversion layer 200 and may cover the whole surface of the color conversion layer 200. The encapsulation film 400 may be in direct contact with the color conversion layer 200, and may be in direct contact with the upper surface of the quantum dot-polymer pattern 200*a*-1 of the first color conversion region 200*a*, the upper surface of the quantum dot-polymer pattern 200*b*-1 of the second color conversion region 200*b*, and the upper surface of the polymer pattern 200*c*-1 of the light-transmitting region 200*c* and the upper surface of the partition wall 220, respectively.

In addition, as described herein, the upper surfaces 200*au*, 200*bu*, and 200*cu* of the quantum dot-polymer patterns 200*a*-1 and 200*b*-1 of the first and second color conversion regions 200*a* and 200*b* may be substantially flat and have low surface roughness, and the encapsulation film 400 may be substantially in contact with the whole surface of the quantum dot-polymer patterns 200*a*-1 and 200*b*-1 and the polymer pattern 200*c*-1. Therefore, in an embodiment, an organic film such as an overcoat layer for removing the uneven thickness and step differences of the color conversion layer 200 between the color conversion layer 200 and the encapsulation film 400 may not be separately included and thus light loss due to the organic film may be prevented to prevent a decrease in luminance.

The encapsulation film 400 may have a very thin thickness compared with the color filter layer 200. For example, the quantum dot-polymer patterns 200*a*-1 and 200*b*-1 or the polymer pattern 200*c*-1 may have a thickness of about 10 times or more of the thickness of the encapsulation film 400, within the disclosed range, about 20 times or more, about 30 times or more, about 50 times or more, about 100 times or more, about 200 times or more, about 300 times or more or about 500 times or more, and within the disclosed range, about 10 times to about 1,000 times, about 20 times to about 1,000 times, about 30 times to about 1,000 times, about 50 times to about 1,000 times, about 100 times to about 1,000 times, about 200 times to about 1,000 times, about 300 times to about 1,000 times, or about 500 times to about 1,000 times of the thickness of the encapsulation film 400.

For example, each thickness of the quantum dot-polymer patterns 200*a*-1 and 200*b*-1 and the polymer pattern 200*c*-1 may be about 5 μm to about 20 μm, within the disclosed range about 6 μm to about 18 μm, about 6 μm to about 15

μm or about 6 μm to about 12 μm, and the thickness of the encapsulation film 40 may be less than or equal to about 500 nm and within the disclosed range, about 10 nm to about 500 nm, about 10 nm to about 450 nm, about 10 nm to about 400 nm, about 10 nm to about 350 nm, about 10 nm to about 300 nm, about 10 nm to about 250 nm, about 10 nm to about 200 nm, about 10 nm to about 150 nm, or about 10 nm to about 100 nm.

As described herein, the upper surfaces 200*au*, 200*bu*, and 200*cu* of the quantum dot-polymer patterns 200*a*-1 and 200*b*-1 and the polymer pattern 200*c*-1 may have high flatness, and the upper surfaces 200*au*, 200*bu*, and 200*cu* of the quantum dot-polymer patterns 200*a*-1 and 200*b*-1 and the polymer pattern 200*c*-1 may be completely sealed, even if the thin encapsulation film 400 is included as described herein.

For example, each average roughness ($R_a$) of the upper surfaces 200*au*, 200*bu*, and 200*cu* of the quantum dot-polymer patterns 200*a*-1 and 200*b*-1 and polymer pattern 200*c*-1 may be less than or equal to about 3% of the thickness of the encapsulation film 400, within the disclosed range, less than or equal to about 2.5%, less than or equal to about 2.0%, less than or equal to about 1.5%, or less than or equal to about 1.0%, and within the disclosed range, about 0.01% to about 3%, about 0.01% to about 2.5%, about 0.01% to about 2.0%, about 0.01% to about 1.5% or about 0.01% to about 1.0% of the thickness of the encapsulation film 400.

For example, the maximum profile peak height ($R_p$) of the roughness profile of the upper surfaces 200*au*, 200*bu*, and 200*cu* of the quantum dot-polymer patterns 200*a*-1 and 200*b*-1 and the polymer pattern 200*c*-1 may be lower, e.g., less, than the thickness of the encapsulation film 400. For example, the maximum profile peak height ($R_p$) of the roughness profile of the upper surfaces 200*au*, 200*bu*, and 200*cu* of the quantum dot-polymer patterns 200*a*-1 and 200*b*-1 and the polymer pattern 200*c*-1 may be less than or equal to about 50% of the thickness of the encapsulation film 400, within the disclosed range, less than or equal to about 45%, less than or equal to about 40%, less than or equal to about 35%, less than or equal to about 30%, less than or equal to about 25%, less than or equal to about 20%, less than or equal to about 15%, or less than or equal to about 10%, and within the disclosed range, about 0.1% to about 50%, about 0.1% to about 45%, about 0.1% to about 40%, about 0.1% to about 35%, about 0.1% to about 30%, about 0.1% to about 25%, about 0.1% to about 20%, about 0.1% to about 15%, or about 0.1% to about 10% of the thickness of the encapsulation film 400.

Accordingly, the encapsulation film 400 may seal the upper surfaces 200*au*, 200*bu*, and 200*cu* of the quantum dot-polymer patterns 200*a*-1 and 200*b*-1 and the polymer pattern 200*c*-1, deterioration of the quantum dot-polymer patterns 200*a*-1 and 200*b*-1 and the polymer patterns 200*c*-1 by oxygen, moisture, or a combination thereof introduced from the outside may be prevented, and thus a display panel 300 with high luminance and long life-span may be implemented.

The encapsulation film 400 may include an inorganic material, an organic-inorganic material, or a combination thereof. The inorganic material may include, for example, an oxide, a nitride, an oxynitride, or a combination thereof, for example silicon oxide, silicon nitride, silicon oxynitride, aluminum oxide, aluminum nitride, aluminum oxynitride, zirconium oxide, zirconium nitride, zirconium oxynitride, titanium oxide, titanium nitride, titanium oxynitride, hafnium oxide, hafnium nitride, hafnium oxynitride, tantalum oxide, tantalum nitride, tantalum oxynitride, lithium fluoride, or a combination thereof, but is not limited thereto. The organic-inorganic material may include, for example, polyorganosiloxane, but is not limited thereto.

For example, the encapsulation film 400 includes a lower encapsulation film 410 in contact with the upper surface of the color conversion layer 200 and an upper encapsulation film 420 disposed on the lower encapsulation film 410. The lower encapsulation film 410 may include an inorganic material, an organic-inorganic material, or a combination thereof, which may form a film in relatively short time at a relatively low temperature, and accordingly, effectively prevent damage, degradation, or a combination thereof of the color conversion layer 200 during the process. The upper encapsulation film 420 may include an inorganic material, organic-inorganic material, or a combination thereof having a dense film quality, and accordingly, more effectively block transmittance of oxygen, moisture, or a combination thereof. For example, the lower encapsulation film 410 and the upper encapsulation film 420 may include the same inorganic material, organic-inorganic material, or combination thereof each other but have different film qualities, for example, according to differences in a process temperature, a process method, process time, and the like. For example, the lower encapsulation film 410 and the upper encapsulation film 420 may include an inorganic material, an organic-inorganic material, or a combination thereof, which differ each other but satisfy each of the aforementioned characteristics.

The encapsulation film 400 may have a higher refractive index than that of the color conversion layer 200, and the upper encapsulation film 420 may have an equal or higher refractive index than the lower encapsulation film 410. Accordingly, each layer may reduce or prevent reflection, and the light emitted from the color conversion layer 200 may effectively pass through the encapsulation film 410. For example, the lower encapsulation film 410 and the upper encapsulation film 420 may respectively have a refractive index of greater than or equal to about 1.8 and within the disclosed range, about 1.8 to about 2.2 or about 1.9 to about 2.1.

The color filter layer 230 is disposed on the color conversion layer 200 in a direction that the light passing through the color conversion layer 200 is emitted (e.g., on the upper portion of the color conversion layer 200 and the encapsulation film 400). The color filter layer 230 includes a first color filter 230*a* overlapping with the first color conversion region 200*a*, a second color filter 230*b* overlapping with the second color conversion region 200*b*, and a third color filter 230*c* overlapping with the light-transmitting region 200*c*.

The first, second, and third color filters 230*a*, 230*b*, and 230*c* each may be configured to selectively transmit light of the same wavelength spectrum as emitted from the quantum dot-polymer patterns 200*a*-1 and 200*b*-1 or passing through the polymer pattern 200*c*-1. For example, when red light is emitted from the quantum dot-polymer pattern 200*a*-1 of the first color conversion region 200*a*, the first color filter 230*a* may be a red filter configured to selectively transmit light of a red wavelength spectrum but absorb light of the other wavelength spectra, reflect light of the other wavelength spectra, or a combination thereof. For example, when green light is emitted from the quantum dot-polymer pattern 200*b*-1 of the second color conversion region 200*b*, the second color filter 230*b* may be a green filter configured to selectively transmit light of a green wavelength spectrum but absorb light of the other wavelength spectra, reflect light of the other wavelength spectra, or a combination thereof. For example, when the polymer pattern 200*c*-1 of the light-transmitting region 200c passes blue light emitted from the light emitting device 200c, e.g., when blue light is emitted from the polymer pattern 200c-1 of the light emitting device 200c, the third color filter 230c may be a blue filter configured to selectively transmit light of a blue wavelength spectrum but absorb light of the other wavelength spectra, reflect light of the other wavelength spectra, or a combination thereof.

The color filter layer 230 may more precisely filter the light emitted or passed through the color conversion layer 200 to increase color purity of the light emitted toward an observer (e.g., on the upper portion of the color filter layer 230). For example, the first color filter 230a may block light not converted by the first quantum dots in the quantum dot-polymer pattern 200a-1 of the first color conversion region 200a but transmitted as is (e.g., light emitted from the light emitting device 200a but not converted by the first quantum dots), for example, to increase color purity of red light. For example, the second color filter 230b may block light not converted by the second quantum dots in the quantum dot-polymer pattern 200b-1 of the second color conversion region 200b but transmitted as is (e.g., light emitted from the light emitting device 200b but not converted by the second quantum dots), for example, to increase color purity of green light. For example, the third color filter 230c may increase color purity of blue light by blocking the other light excluding the blue light. For example, the first color filters 230a, the second color filters 230b, the third color filter 230c, or a combination thereof may be omitted, for example, the third color filter 230c overlapping with the light-transmitting region 200c may be omitted.

The color filter layer 230 may have a thickness of about 500 nm to about 3 μm. The color filter layer 230 may be thinner than the disclosed color conversion layer 200 and as described herein, stably formed by the color conversion layer 200 with a high flatness.

The aforementioned display panel 300 may be applied to various electronic devices including a display device, and may be applied to a display device such as a television (TV), a monitor, a computer, a tablet personal computer (PC), a mobile, VR (virtual reality), AR (augmented reality), or a lighting device such as a light source.

Hereinafter, an example of the aforementioned method of manufacturing the display panel 300 is described with reference to FIGS. 1 and 2.

A method of manufacturing the display panel 300 according to an embodiment includes forming a light emitting device array 100 including a plurality of light emitting devices 100a, 100b, and 100c on a substrate 110; forming a color conversion layer 200 on the light emitting device array 100; forming the encapsulation film 400 on the color conversion layer 200; and forming the color filter layer 230 on the encapsulation film 400.

The forming of the color conversion layer 200 may include forming partition walls 220 to define a plurality of regions including a first color conversion region 200a, a second color conversion region 200b, and a light-transmitting region 200c; forming a quantum dot-polymer pattern 200a-1 in the first color conversion region 200a; forming a quantum dot-polymer pattern 200b-1 in the second color conversion region 200b; and forming a polymer pattern 200c-1 in the light-transmitting region 200c. The order of the forming of the quantum dot-polymer pattern 200a-1 in the first color conversion region 200a, the forming of the quantum dot-polymer pattern 200b-1 in the second color conversion region 200b, and the forming of the polymer pattern 200c-1 in the light-transmitting region 200c may be changed.

The forming of the partition walls 220 may include, for example, forming an insulating film for partition walls having a predetermined thickness on the light emitting device array 100, and patterning the insulating film by photolithography to form, for example, the partition walls 220 of a grid pattern defining a plurality of regions.

The forming of the quantum dot-polymer patterns 200a-1 and 200b-1 and the forming of the polymer pattern 200c-1 may include, for example, preparing a curable composition; applying the curable composition to each region in the partition wall 220; exposing the applied curable composition to photolithography to form the quantum dot-polymer patterns 200a-1 and 200b-1 or the polymer pattern 200c-1.

Herein, the photolithography may be, for example, negative photolithography.

The curable composition may be, for example, a solvent-free curable composition that does not include a solvent. The solvent-free curable composition may be substantially free of organic solvents that may volatilize during processing. The solvent-free curable composition may include, for example, quantum dots and a curable monomer.

For example, the solvent-free curable composition may include quantum dots, a metal catalyst, an aromatic halide compound, and a curable monomer.

The curable monomer may include, for example, an ene compound having a, e.g., at least one, (e.g., sp2 or sp hybridized) C—H moiety and a carbon-carbon unsaturated bond. The solvent-free curable composition may optionally further include the aforementioned scattering particles.

The quantum dots are as described herein, and may include, for example, an organic ligand having a hydrophobic moiety. The organic ligand may include, for example RCOOH, $RNH_2$, $R_2NH$, $R_3N$, RSH, $R_3PO$, $R_3P$, ROH, RCOOR', $RPO(OH)_2$, RHPOOH, $R_2POOH$, or a combination thereof, wherein R and R' are each independently a substituted or unsubstituted C1 to C40 aliphatic hydrocarbon group, a substituted or unsubstituted C6 to C20 aromatic hydrocarbon group, or a combination thereof. The moiety of the organic ligand may be bound to the surface of the quantum dot.

Examples of the organic ligand may be a thiol compound such as methane thiol, ethane thiol, propane thiol, butane thiol, pentane thiol, hexane thiol, octane thiol, dodecane thiol, hexadecane thiol, octadecane thiol, benzyl thiol, and the like; an amine such as methane amine, ethane amine, propane amine, butane amine, pentyl amine, hexyl amine, octyl amine, nonyl amine, decyl amine, dodecyl amine, hexadecyl amine, octadecyl amine, dimethyl amine, diethyl amine, dipropyl amine, tributyl amine, trioctyl amine, and the like; a carboxylic acid compound such as methanoic acid, ethanoic acid, propanoic acid, butanoic acid, pentanoic acid, hexanoic acid, heptanoic acid, octanoic acid, dodecanoic acid, hexadecanoic acid, octadecanoic acid, oleic acid (oleic acid), benzoic acid, and the like; a phosphine compound such as methyl phosphine, ethyl phosphine, propyl phosphine, butyl phosphine, pentyl phosphine, octylphosphine, dioctyl phosphine, tributyl phosphine, trioctyl phosphine, and the like; a phosphine compound or an oxide compound thereof such as methyl phosphine oxide, ethyl phosphine oxide, propyl phosphine oxide, butyl phosphine oxide pentyl phosphine oxide, tributylphosphine oxide, octylphosphine oxide, dioctyl phosphine oxide, or trioctylphosphine oxide; diphenyl phosphine, triphenyl phosphine, or an oxide compound thereof; a C5 to C20 alkyl phosphinic acid or a C5 to C20 alkyl phosphonic acid such as hexylphosphinic acid, octylphosphinic acid, dodecanephosphinic acid, tetradecanephosphinic acid, hexadecanephosphinic acid, or octadecanephosphinic acid; but is not limited thereto. The quantum dots may include two or more different organic ligands. In an embodiment, the organic ligand may not include a photopolymerizable moiety (e.g., an acrylate group, a methacrylate group, etc.).

The metal catalyst may include a metal salt or a metal coordination body. The metal catalyst may include, for example, palladium, nickel, ruthenium, rhodium, iridium, iron, cobalt, chromium, copper, platinum silver, gold, or a combination thereof, but is not limited thereto.

The aromatic halide compound may include one type or two or more types and may include, for example, a dibromoaryl compound such as dibromoxylene or dibromobenzene; a dichloroaryl compound such as dichloroxylene or dichlorobenzene; a diiodoaryl compound such as diiodobenzene or diiodoxylene; a haloanisole such as bromoanisole; a halotrialkylsilylbenzene such as bromotrimethylsilylbenzene; a haloalkylbenzene such as bromoalkylbenzene, bromododecylbenzene, or bromohexylbenzene; an alkyl halobenzoate such as ethyl bromobenzoate or methyl bromomethyl benzoate; or a combination thereof, but is not limited thereto.

The ene compound may have a, e.g., at least one, (e.g., sp2 or sp hybridized) C—H moiety and a carbon-carbon unsaturated bond, such as a compound having a hydrophobic moiety. The hydrophobic moiety may include a C3 to C50 aliphatic hydrocarbon group, a C6 to C50 aromatic hydrocarbon group, (1 or more or 2 or more and 100 or less, 50 or less, 40 or less, 30 or less, or 20 or less) ethylene oxide repeating units, (1 or more or 2 or more and 100 or less, 50 or less, 40 or less, 30 or less, or 20 or less) propylene oxide repeating units, bisphenol A moiety, —$SiR_3$ group, wherein R's are the same or different and may be a substituted or unsubstituted C1 to C30 alkyl group), or a combination thereof.

The ene compound may include one or two or more types, and may include, for example, an ethylene glycol oligomer having two or more (meth)acrylate groups, a propylene glycol oligomer having two or more (meth)acrylate groups, bisphenol A glycerolate di(meth)acrylate, neopentyl glycol di(meth)acrylate, (meth)acrylate having a C3 to C30 alkyl group, or a combination thereof, but is not limited thereto.

The combination of the aforementioned aromatic halide compound and the ene compound may provide high dispersibility to quantum dots, and thus a composition having high dispersibility may be prepared without a separate solvent.

For example, the solvent-free curable composition may include quantum dots including a plurality of types of organic ligands, a curable monomer, and a dispersant. The solvent-free curable composition may optionally further include the aforementioned scattering particles.

The quantum dots may include the aforementioned first quantum dot or second quantum dot, and may for example have a core including indium (In) and phosphorus (P), and optionally a shell including zinc (Zn) and selenium (Se), sulfur (S), or a combination thereof. For example, the core of the quantum dot may be InP or InZnP, and the shell of the quantum dot may have a layer, e.g., one or more layers, and may each independently be ZnS, ZnSe, or ZnSeS.

The quantum dots may have, for example, two or more types of organic ligands, and may be the aforementioned organic ligands. Two or more types of organic ligands may be thermally decomposable at different temperatures, and for example, peaks may appear in different temperature ranges in a thermogravimetric analysis (TGA) graph of quantum dots measured with a differential scanning calorimeter (DSC). For example, in a thermogravimetric analysis (TGA) graph of quantum dots, a peak between about 200° C. and about 300° C. and a peak between about 400° C. and 500° C. may appear.

For example, the organic ligand may include an organic ligand in which a moiety bonding to the surface of the quantum dot is a carboxyl group and an organic ligand in which a moiety bonding to the surface of the quantum dot is a thiol group. The organic ligand in which the moiety bonding to the surface of the quantum dot is a carboxyl group may be represented by RCOOH or RCOOR', wherein, R and R' are each independently a substituted or unsubstituted C1 to C40 aliphatic hydrocarbon group, a substituted or unsubstituted C6 to C20 aromatic hydrocarbon group, or a combination thereof, for example methanoic acid, ethanoic acid, propanoic acid, butanoic acid, pentanoic acid, hexanoic acid, heptanoic acid, octanoic acid, dodecanoic acid, hexadecanoic acid, octadecanoic acid, oleic acid, palmitic acid, benzoic acid, or a combination thereof, but is not limited thereto. The organic ligand in which the moiety bonding to the surface of the quantum dot is a thiol group may be represented by RSH, wherein, R is a substituted or unsubstituted C1 to C40 aliphatic hydrocarbon group, a substituted or unsubstituted C6 to C20 aromatic hydrocarbon group, or a combination thereof, for example methane thiol, ethane thiol, propane thiol, butane thiol, pentane thiol, hexane thiol, octane thiol, dodecane thiol, hexadecane thiol, octadecane thiol, benzyl thiol, or a combination thereof, but is not limited thereto.

For example, the quantum dot may include the organic ligand in which the moiety bonding to the surface of the quantum dot is the carboxyl group and the organic ligand in which the moiety bonding to the surface of the quantum dot is the thiol group in a predetermined ratio. For example, the organic ligand in which the moiety bonding to the surface of the quantum dot is the carboxyl group and the organic ligand in which the moiety bonding to the surface of the quantum dot is the thiol group may be included in an amount of less than or equal to about 40 mole percent (mol %) and greater than or equal to about 60 mol %, respectively, based on the total organic ligands. For example, the organic ligand in which the moiety bonding to the surface of the quantum dot is the carboxyl group may be included in an amount of about 10 mol % to about 40 mol %, about 15 mol % to about 35 mol %, or about 20 mol % to about 30 mol % based on the total organic ligands. For example, the organic ligand in which the moiety bonding to the surface of the quantum dot is the thiol group may be included in about 60 mol % to about 90 mol %, about 65 mol % to about 85 mol %, or about 70 mol % to about 80 mol % based on the total organic ligands.

The ratio of the organic ligands of the quantum dots may be confirmed from the area ratio of the peaks in the thermogravimetric analysis (TGA) graph of the quantum dots. For example, the area of the peak between about 400° C. to about 500° C. may be about 0.16 times or more and within the disclosed range, about 0.16 times to about 0.5 times, about 0.17 times to about 0.5 times, about 0.18 times to about 0.5 times, about 0.2 times to about 0.5 times, or about 0.3 times to about 0.5 times, relative to the area of the peak between about 200° C. to about 300° C.

The curable monomer may be a thermosetting monomer, a photocurable monomer, or a combination thereof, for example a monomer having a, e.g., at least one, unsaturated double bond, for example a multi-functional monomer having two or more functional groups. The curable monomer may be, for example, a (meth)acrylate compound, an oxetane-based compound, a thiol group-containing compound, or a combination thereof, for example ethylene glycol di(meth)acrylate, diethylene glycol di(meth)acrylate, triethylene glycol di(meth)acrylate, propylene glycol di(meth) acrylate, neopentyl glycol di(meth)acrylate, 1,4-butanediol di(meth)acrylate, 1,6-hexanediol di(meth)acrylate, bisphenol A di(meth)acrylate, pentaerythritol di(meth)acrylate, pentaerythritol tri(meth)acrylate, pentaerythritol tetra(meth) acrylate, pentaerythritol hexa(meth)acrylate, dipentaerythritol di(meth)acrylate, dipentaerythritol tri(meth)acrylate, dipentaerythritol penta(meth)acrylate, dipentaerythritol hexa(meth)acrylate, bisphenol A epoxy(meth)acrylate, ethylene glycol monomethyl ether (meth)acrylate, trimethylolpropane tri(meth)acrylate, tris(meth)acryloyloxyethyl phosphate, novolac epoxy(meth)acrylate, or a combination thereof, but is not limited thereto.

The reaction initiator may be a thermal polymerization initiator, a photopolymerization initiator, or a combination thereof, for example, an acetophenol-based compound, a benzophenone-based compound, a thioxanthone-based compound, a benzoin-based compound, a triazine-based compound, an oxime-based compound, a diazo-based compound, an imidazole-based compound, or a combination thereof, but is not limited thereto.

The binder may be, for example, a polymer binder, for example, a copolymer binder including two or more different structural units. The binder may be, for example, a (meth)acrylic binder having a structural unit having a (meth) acrylate group, e.g., one or more (meth)acrylate groups, for example a (meth)acrylic acid/benzyl(meth)acrylate copolymer, a (meth)acrylic acid/benzyl(meth)acrylate/styrene copolymer, a (meth)acrylic acid/benzyl(meth)acrylate/2-hydroxyethyl(meth)acrylate copolymer, a (meth)acrylic acid/ benzyl(meth)acrylate/styrene/2-hydroxyethyl(meth)acrylate copolymer, or a combination thereof, but is not limited thereto. The weight average molecular weight of the binder may be about 5,000 to about 15,000 grams per mole (g/mol), or within the disclosed range, about 7,000 g/mol to about 12,000 g/mol, or about 8,000 g/mol to about 12,000 g/mol, but is not limited thereto.

The dispersant may include, for example, a cationic dispersant, an anionic dispersant, an amphoteric dispersant, a silicone-based dispersant, a fluorine-based dispersant, a polymer dispersant, or a combination thereof. The polymer dispersant may include, for example, polymers of unsaturated carboxylic acids or esters thereof, such as polyacrylic acid or polyacrylic acid esters; poly(oxy)alkylene glycol or esters thereof; polyurethane; polyamide; polysiloxane; polyaminoamide; polyethyleneimine; polyarylamine; or a combination thereof, but is not limited thereto. For example, the dispersant may include a carboxyl group-containing compound.

The solvent-free curable composition for the quantum dot-polymer patterns 200_a_-1 and 200_b_-1 may impart high dispersibility to the composition through the control of the organic ligand of the quantum dot as described herein, and thus the quantum dot-polymer patterns 200_a_-1 and 200_b_-1 may be obtained without a separate solvent. The quantum dots-polymer patterns 200_a_-1 and 200_b_-1 formed from such a solvent-free curable composition may further include a component (e.g., a polymerization product) derived from another organic material in addition to the organic ligand bound to the aforementioned quantum dots, and the thermogravimetric analysis (TGA) graph measured by the differential scanning calorimeter (DSC) may be different from the thermogravimetric analysis (TGA) graph measured by the differential scanning calorimeter (DSC) of the aforementioned quantum dots. For example, in the thermogravimetric analysis (TGA) graph, the intensity of the peak between about 350° C. and about 450° C. may be greater than the intensity of the peak between about 200° C. and about 300° C. For example, in the thermogravimetric analysis (TGA) graph, the intensity of the peak between about 350° C. to about 450° C. may be about 8 times to about 20 times, and within the range of about 9 times to about 20 times, about 10 times to about 20 times, about 8 times to about 13 times, about 9 times to about 13 times, or about 10 times to about 13 times, relative to the intensity of the peak present between about 200° C. to about 300° C.

As described herein, in an embodiment, the quantum dot-polymer patterns 200_a_-1 and 200_b_-1 may be formed using the solvent-free curable composition, a separate solvent may not be included, and pores generated by volatilization of the solvent in the composition in a subsequent process using heat, light, or a combination thereof, in the quantum dot-polymer patterns 200_a_-1 and 200_b_-1 and the polymer pattern 200_c_-1 and a decrease of the flatness of the upper surfaces 200_au_, 200_bu_, and 200_cu_ may be prevented. Accordingly, the aforementioned quantum dots-polymer patterns 200_a_-1 and 200_b_-1 and polymer patterns 200_c_-1 may have relatively low surface roughness and high thickness uniformity.

For example, the curable composition may be, for example, a solvent-containing composition.

The composition for the quantum dot-polymer patterns 200_a_-1 and 200_b_-1 may include, for example, quantum dots, a curable monomer, a reaction initiator, and a solvent, and may optionally further include a binder, a dispersant, or a combination thereof. The composition for the polymer pattern 200_c_-1 may include, for example, a curable monomer, a reaction initiator, and a solvent, and may optionally further include a binder, a dispersant, or a combination thereof.

The curable monomer, the reaction initiator, the binder, and the dispersant are the same as described herein.

The solvent is not particularly limited and can dissolve or disperse the curable monomer, the reaction initiator, the binder, and the dispersant and may include, for example an alcohol such as methanol, ethanol, and the like; an ether such as dichloroethyl ether, n-butyl ether, diisoamyl ether, methylphenyl ether, tetrahydrofuran, and the like; a glycol ether such as ethylene glycol methyl ether, ethylene glycol ethyl ether, propylene glycol methyl ether, and the like; a cellosolve acetate such as methyl cellosolve acetate, ethyl cellosolve acetate, diethyl cellosolve acetate, and the like; a carbitol such as methyl ethyl carbitol, diethyl carbitol, diethylene glycol monomethyl ether, diethylene glycol monoethyl ether, diethylene glycol dimethyl ether, diethylene glycol methyl ethyl ether, diethylene glycol diethyl ether, and the like; a propylene glycol alkyl ether acetate such as propylene glycol methyl ether acetate, propylene glycol propyl ether acetate, and the like; aromatic hydrocarbons such as toluene, xylene, and the like; a ketone such as methyl ethyl ketone, cyclohexanone, 4-hydroxy-4-methyl-2-pentanone, methyl-n-propyl ketone, methyl-n-butyl ketone, methyl-n-amyl ketone, 2-heptanone, and the like; a saturated aliphatic monocarboxylic acid alkyl ester such as ethyl acetate, n-butyl acetate, isobutyl acetate, and the like; an alkyl lactate ester such as methyl lactate, ethyl lactate, and the like; an alkyl hydroxyacetate ester such as methyl hydroxyacetate, ethyl hydroxyacetate, butyl hydroxyacetate, and the like; an alkoxyalkyl acetate ester such as methoxymethyl acetate, methoxyethyl acetate, methoxybutyl acetate, ethoxymethyl acetate, ethoxyethyl acetate, and the like; a 3-hydroxypropionic acid alkyl ester such as methyl 3-hydroxypropionate, ethyl 3-hydroxypropionate, and the like; a 3-alkoxypropionic acid alkyl ester such as methyl 3-methoxypropionate, ethyl 3-methoxypropionate, ethyl 3-ethoxypropionate, methyl 3-ethoxypropionate, and the like; a 2-hydroxypropionic acid alkyl ester such as methyl 2-hydroxypropionate, ethyl 2-hydroxypropionate, propyl 2-hydroxypropionate, and the like; a 2-alkoxypropionic acid alkyl ester such as methyl 2-methoxypropionate, ethyl 2-methoxypropionate, ethyl 2-ethoxypropionate, methyl 2-ethoxypropionate, and the like; a 2-hydroxy-2-methylpropionic acid alkyl ester such as methyl 2-hydroxy-2-methylpropionate, ethyl 2-hydroxy-2-methylpropionate, and the like; a 2-alkoxy-2-methylpropionic acid alkyl ester such as methyl 2-methoxy-2-methylpropionate, ethyl 2-ethoxy-2-methylpropionate, and the like; an ester such as 2-hydroxyethyl propionate, 2-hydroxy-2-methyl ethyl propionate, hydroxyethyl acetate, methyl 2-hydroxy-3-methylbutanoate, and the like; a ketone ester such as ethyl pyruvate, and the like; N-methylformamide; N,N-dimethyl formamide; N-methylformanilide; N-methylacetamide; N,N-dimethyl acetamide; N-methylpyrrolidone; dimethylsulfoxide; benzyl ethyl ether; dihexyl ether; acetylacetone; isophorone; caproic acid; caprylic acid; 1-octanol; 1-nonanol; benzyl alcohol; benzyl acetate; ethyl benzoate; diethyl oxalate; diethyl maleate; γ-butyrolactone; ethylene carbonate; propylene carbonate; phenyl cellosolve acetate, or a combination thereof, but is not limited thereto.

When using a solvent-containing composition, by performing removing the solvent in advance before the thermal process, exposure process, or a combination hereof as described herein, it may be possible to prevent pores that may be generated by volatilization of a solvent in the composition in a subsequent process using heat, light, or a combination thereof, in the quantum dot-polymer patterns 200*a*-1 and 200*b*-1 and the polymer pattern 200*c*-1 and a decrease in the flatness of the upper surfaces 200*au*, 200*bu*, and 2020*cu*. Accordingly, the aforementioned quantum dot-polymer patterns 200*a*-1 and 200*b*-1 and the polymer pattern 200*c*-1 may have relatively low surface roughness and high thickness uniformity.

The quantum dot-polymer patterns 200*a*-1 and 200*b*-1 and the light-transmitting pattern 200*c*-1 are formed using the aforementioned curable composition. Herein, for convenience of explanation, forming of the quantum dot-polymer pattern 200*a*-1 in the first color conversion region 200*a*, forming of the quantum dot-polymer pattern 200*b*-1 in the second color conversion region 200*b*, and forming of the polymer pattern 200*c*-1 in the light-transmitting region 200*c* are described, but the order thereof is not limited thereto and the order thereof may be changed.

First, forming of the quantum dot-polymer pattern 200*a*-1 in the first color conversion region 200*a* is described.

A curable composition for the quantum dot-polymer pattern 200*a*-1 is applied to each region within the partition wall 220. The curable composition may be applied by, for example, a solution process such as spin coating, slit coating, inkjet coating, or dip coating, but is not limited thereto. The curable composition may be applied to any region other than the corresponding region.

For example, when the curable composition for the quantum dot-polymer pattern 200*a*-1 is the aforementioned solvent-containing curable composition, for example, removing the solvent may be additionally performed. The removing of the solvent may be performed, for example, by volatilizing the solvent in the composition under vacuum.

Subsequently, the applied curable composition for the quantum dot-polymer pattern 200*a*-1 is annealed. Annealing may be performed, for example, at about 50° C. to about 120° C. for about 5 minutes to about 10 hours.

Subsequently, a mask (not shown) is disposed on the applied curable composition for the quantum dot-polymer pattern 200*a*-1 and exposed to light. The mask may have an opening configured to transmit the light and a light-blocking portion configured to block the light, and the opening of the mask may be disposed to correspond to a region where the first color conversion region 200*a* is formed. Subsequently, light, such as ultraviolet (UV) light, is irradiated over the mask to selectively expose the composition in the first color conversion region 200*a* through negative photolithography. Subsequently, the quantum dot-polymer pattern 200*a*-1 may be selectively formed in the first color conversion region 200*a* by all removing all the unexposed composition other than the first color conversion region 200*a*.

The quantum dot-polymer pattern 200*a*-1 may be formed by applying the aforementioned solvent-free curable composition or by applying a solvent-containing composition and additionally performing a solvent removal process, solvent volatilization may not substantially occur during the thermal process, optical process, or a combination thereof, and in addition, the solvent may not be substantially included in a final product.

Subsequently, the forming the quantum dot-polymer pattern 200*b*-1 in the second color conversion region 200*b* is illustrated.

The forming the quantum dot-polymer pattern 200*b*-1 in the second color conversion region 200*b* may be performed according to the disclosed process except that a curable composition for the quantum dot-polymer pattern 200*b*-1 including the second quantum dots is used instead of the curable composition for the quantum dot-polymer pattern 200*a*-1 including the first quantum dots.

In other words, the curable composition for the quantum dot-polymer pattern 200*b*-1 is applied to each region of the partition wall 220. When the curable composition for the quantum dot-polymer pattern 200*b*-1 is the disclosed solvent-containing curable composition, a solvent removal process may be additionally performed, for example, the solvent in the composition may be volatilized under vacuum.

Subsequently, the applied curable composition for the quantum dot-polymer pattern 200*b*-1 is annealed, and a mask may be disposed over the curable composition for the quantum dot-polymer pattern 200*b*-1 and exposed to light. An opening of the mask may be disposed to overlap with a region where the second color conversion region 200*b* is supposed to be formed. Subsequently, light, such as UV light, is irradiated over the mask to selectively expose the composition in the second color conversion region 200*b* through negative photolithography. Subsequently, all the unexposed composition other than the second color conversion region 200*b* is removed by development to selectively form the quantum dot-polymer pattern 200*b*-1 in the second color conversion region 200*b*.

The quantum dot-polymer pattern 200*b*-1 may be formed by applying the aforementioned solvent-free curable composition or by applying a solvent-containing composition and additionally performing a solvent removal process, solvent volatilization may not substantially occur during the thermal process, optical process, or a combination thereof, and in addition, the solvent may not be substantially included in a final product.

Subsequently, the forming the polymer pattern 200*c*-1 in the light-transmitting region 200*c* is illustrated.

The forming the polymer pattern 200*c*-1 in the light-transmitting region 200*c* may be performed according to the disclosed process except that a curable composition for the polymer pattern 200*c*-1 is used instead of the curable composition for the quantum dot-polymer pattern 200*a*-1.

In other words, the curable composition for the polymer pattern 200*c*-1 is applied to each region in the partition wall 220. When the curable composition for the polymer pattern 200*c*-1 is the disclosed solvent-containing curable composition, a solvent removal process may be additionally performed, for example, a solvent in the composition may be volatilized under vacuum.

Subsequently, on the applied curable composition for the polymer pattern 200*c*-1, a mask may be disposed and exposed to light. An opening of the mask may be disposed to overlap with a region where the light-transmitting region 200*c* is supposed to be formed. Subsequently, light, such as UV light, is irradiated over the mask to selectively expose the composition in the light-transmitting region 200*c* through negative photolithography. Subsequently, all the unexposed composition other than the light-transmitting region 200*c* is removed by development to selectively form the polymer pattern 200*c*-1 in the light-transmitting region 200*c*.

The polymer pattern 200*c*-1 may be formed by applying the aforementioned solvent-free curable composition or by applying a solvent-containing composition and additionally performing a solvent removal process, solvent volatilization may not substantially occur during the thermal process, optical process, or a combination thereof, and in addition, the solvent may not be substantially included in a final product.

Accordingly, the quantum dot-polymer pattern 200*a*-1 may be formed in the first color conversion region 200*a*, the quantum dot-polymer pattern 200*b*-1 may be formed in the second color conversion region 200*b*, and the polymer pattern 200*c*-1 may be formed in the light-transmitting region 200*c*, and each of the quantum dot-polymer patterns 200*a*-1 and 200*b*-1 and the polymer pattern 200*c*-1, as described herein, may have relatively low surface roughness and high thickness uniformity.

The forming the encapsulation film 400 may be, for example, performed by applying an inorganic material such as oxide, nitride, and oxynitride, an organic-inorganic material such as polyorganosiloxane, or a combination thereof, for example, through chemical vapor deposition (CVD), atomic layer deposition, thermal evaporation, or a combination thereof.

The forming the encapsulation film 400 may include the forming the lower encapsulation film 410 and the forming the upper encapsulation film 420. For example, the lower encapsulation film 410 and the upper encapsulation film 420 may be formed at an equal or different temperature, for example, the lower encapsulation film 410 may be formed at a lower temperature than that of the upper encapsulation film 420. For example, the lower encapsulation film 410 may be formed at less than or equal to about 180° C., within the disclosed range, less than or equal to about 160° C., about 80° C. to about 180° C., or about 80° C. to about 160° C. and accordingly, prevent degradation of the color conversion layer 200. For example, the upper encapsulation film 420 may be formed at an equal or higher temperature than that of the lower encapsulation film 410, for example, at about 150° C. to about 300° C., about 180° C. to about 280° C., or about 200° C. to about 280° C. and accordingly, formed as a dense thin film, effectively blocking an inflow of moisture, oxygen, or a combination thereof from the outside.

The forming the color filter 230 may be formed by applying a composition for a color filter and performing an exposure, for example, through negative photolithography, to sequentially form the first, second, and third color filters 230*a*, 230*b*, and 230*c*.

As described herein, the quantum dot polymer patterns 200*a*-1 and 200*b*-1 and the polymer pattern 200*c*-1 may have no substantial solvent volatilization in a subsequent process according to the aforementioned method and accordingly, have relatively low surface roughness and high thickness uniformity (flatness). Accordingly, on the quantum dot-polymer patterns 200*a*-1 and 200*b*-1 and the polymer pattern 200*c*-1, even though the encapsulation film 400 is formed to be much thinner, whole surfaces between the quantum dot-polymer patterns 200*a*-1 and 200*b*-1 and the encapsulation film 400 and a whole surface of the polymer pattern 200*c*-1 and the encapsulation film 400 may be in close contact and sealed each other. Accordingly, the quantum dot-polymer patterns 200*a*-1 and 200*b*-1 and the polymer pattern 200*c*-1 may be prevented from degradation by oxygen, moisture, or a combination thereof inflowing from the outside, realizing the display panel 300 with high luminance and a long life-span.

Hereinafter, the embodiments are illustrated in more detail with reference to examples. However, these examples are exemplary, and the scope of claims is not limited thereto.

EXAMPLES

Analysis Methods

1. Ultraviolet-Visible (UV-Vis) Spectroscopic Analysis

Ultraviolet (UV) spectroscopic analysis is performed using an Agilent Cary5000 spectrometer and UV-Visible absorption spectra are obtained.

2. Photoluminescence Analysis

A photoluminescence (PL) spectrum of quantum dots at an excitation wavelength of 450 nanometers (nm) is obtained using a Hitachi F-7000 spectrometer.

3. Inductively Coupled Plasma (ICP) Analysis

Inductively coupled plasma atomic emission spectroscopy (ICP-AES) is performed using a Shimadzu ICPS-8100.

4. Thermogravimetric Analysis (TGA) Method

Thermogravimetric analysis (TGA) is an analysis method that measures a weight change of a sample for a predetermined period of time, while changing a temperature at a constant rate. A mass-temperature curve obtained by TGA exhibits thermal stability of the sample, a composition ratio of mixing materials, and a thermal composition of an intermediate generated during the heating and also, informs a composition of a remnant (ash) when the heating is completed. Measurements in the present experiment are performed under a nitrogen ($N_2$) atmosphere, while the temperature is increased from room temperature (RT) to about 600° C. at 10° C. per minute.

5. Method for Measuring Reliability (Luminance) of Quantum Dot-Polymer Patterns

A quantum dot-polymer pattern is formed on a glass substrate, and a capping layer is formed thereon. Subsequently, this substrate obtained therefrom is fixed on a light emitting diode (LED) chip, and an appropriate voltage is applied thereto to measure reliability within a desired luminance range.

Synthesis Examples

Synthesis Example 1: Preparation of Green Quantum Dot (1) Step 1: Synthesis of InP Core Quantum Dot In a 200 milliliter (mL) reaction flask, indium acetate and palmitic acid are dissolved in 1-octadecene and then, heated at 120° C. under vacuum. Herein, a mole ratio of indium and palmitic acid is 1:3. After 1 hour, an atmosphere in the reactor is converted into nitrogen. After heating the reactor at 280° C., a mixed solution of tris(trimethylsilyl)phosphine (TMS3P) and trioctylphosphine is rapidly injected thereinto and then, reacted for 20 minutes. Acetone is added to the reaction solution cooled down to room temperature, and then, precipitates centrifuged therefrom are dispersed again in toluene to prepare InP core quantum dot dispersion. Herein, TMS3P is used in an amount of 0.5 moles per 1 mole of indium. The InP core quantum dot has a particle diameter of about 2 nm.

(2) Step 2: Synthesis of InP/ZnSe/ZnS Core-Shell Quantum Dot

A Se/trioctylphosphine (TOP) stock solution is prepared by dispersing selenium in trioctylphosphine, and a S/TOP stock solution is prepared by dispersing sulfur in trioctylphosphine.

In a 200 mL reaction flask, zinc acetate and oleic acid are dissolved in trioctylamine and then, vacuum-treated at 120° C. for 10 minutes. After internally substituting the reaction flask with $N_2$, the InP core quantum dot dispersion obtained in Step 1 is injected thereinto, while the obtained solution is heated up to 320° C., and the Se/TOP stock solution is several times injected thereinto. A reaction is performed to obtain a reaction solution including particles in which ZnSe shell quantum dots are disposed on InP core quantum dots. Total reaction time is approximately about 100 minutes, and a total content of Se per 1 mole of indium is approximately 23 moles.

Subsequently, the S/TOP stock solution is injected into the reaction solution at the reaction temperature. A reaction is performed to obtain a reaction solution including particles in which the ZnS shell quantum dots are disposed on the ZnSe shell quantum dots. A total reaction time is 60 minutes, and a total content of S for 1 mole of indium is approximately 13 moles. Subsequently, the reaction solution is cooled down to room temperature, an excess of ethanol is added thereto and then, centrifuged, and after discarding a supernatant, precipitates therein are dried and dispersed in cyclohexyl acetate, obtaining InP/ZnSe/ZnS core-shell quantum dot dispersion.

(3) Step 3: Synthesis of Surface-modified InP/ZnSe/ZnS Core-Shell Quantum Dot

The InP/ZnSe/ZnS core-shell quantum dot dispersion (a quantum dot content of about 26 weight percent (wt %) to 27 wt %) obtained in Step 2 is metered in a 3-neck round-bottomed flask in which a magnetic bar is placed. A thiol compound represented by Chemical Formula A is added thereto. Subsequently, the mixture is well mixed for about 1 minute and then, stirred at 80° C. under a nitrogen atmosphere. The stirring time is changed to control a substitution degree of the thiol compound represented by Chemical Formula A, which is obtained in Step 2, instead of the oleic acid bonded to the surface of the quantum dot.

Before the substitution reaction is completely completed, that is, when a portion of the oleic acid bonded to the surface of the quantum dots is substituted with the compound represented by Chemical Formula A, the reaction solution is cooled down to room temperature and then, added to cyclohexane, precipitating the quantum dots. Subsequently, the precipitated quantum dots are separated through centrifugation and sufficiently dried in a vacuum oven for a day, obtaining surface-modified quantum dots including the oleic acid and the thiol compound represented by Chemical Formula A on the surface. The surface-modified quantum dots are added to triethylene glycol dimethacrylate (Miwon Commercial Co., Ltd.) and then, stirred for about 12 hours, obtaining surface-modified green quantum dot (InP/ZnSe/ZnS core-shell quantum dot) dispersion.

Chemical Formula A

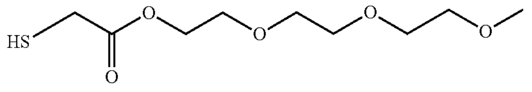

Synthesis Example 2: Preparation of Red Quantum Dot (InP/ZnSe/ZnS)

(1) Step 1: Synthesis of InP Core Quantum Dot

In a 200 mL reaction flask, indium acetate and palmitic acid are dissolved in 1-octadecene and then, heated at 120° C. under vacuum. Herein, a mole ratio of indium and palmitic acid is 1:3. After 1 hour, an atmosphere in the reactor is converted into nitrogen. After heating the reactor at 280° C., a mixed solution of tris(trimethylsilyl)phosphine (TMS3P) and trioctylphosphine is rapidly injected thereinto and then, reacted for 20 minutes. Acetone is added to the reaction solution cooled down to room temperature, and then, precipitates centrifuged therefrom are dispersed again in toluene to prepare InP core quantum dot dispersion. Herein, TMS3P is used in an amount of 0.75 moles per 1 mole of indium. The InP core quantum dot has a particle diameter of about 3.6 nm.

(2) Step 2: Synthesis of InP/ZnSe/ZnS Core-Shell Quantum Dot

A Se/TOP stock solution is prepared by dispersing selenium in trioctylphosphine, and a S/TOP stock solution is prepared by dispersing sulfur in trioctylphosphine.

In a reaction flask, 7.2 millimoles (mmol) of zinc acetate and oleic acid are dissolved in trioctylamine and then, vacuum-treated at 120° C. for 30 minutes and heated at 280° C. for 10 minutes under a nitrogen atmosphere, preparing a reaction medium including a zinc precursor.

The prepared zinc precursor-containing reaction medium is cooled down to 180° C., the InP core quantum dot dispersion prepared in Step 1 is added thereto, and the obtained reaction system is heated at 320° C., and Se/TOP and additional zinc precursors are injected into the reaction flask and then, reacted for about 30 minutes. Subsequently, the S/TOP stock solution and the zinc precursors separately prepared in the disclosed manner are added to the reaction solution and then, reacted again for about 60 minutes and rapidly cooled down to room temperature.

A total content of Se per 1 mole of indium is about 12 moles, and a total content of S per 1 mole of indium is about 5 moles. Subsequently, the reaction solution is cooled down to room temperature, an excess of ethanol is added thereto and centrifuged, and after discarding a supernatant therefrom, precipitates therein are dried and dispersed in cyclohexyl acetate, obtaining InP/ZnSe/ZnS core-shell quantum dot dispersion.

(3) Step 3: Synthesis of Surface-Modified InP/ZnSe/ZnS Core-Shell Quantum Dot

Surface-modified red quantum dot (InP/ZnSe/ZnS core-shell quantum dot) dispersion is obtained according to the same method as Step 3 of Synthesis Example 1 except that the InP/ZnSe/ZnS core-shell quantum dot dispersion of Step 2 is used.

Evaluation I

The surface modified green quantum dot dispersion and the red quantum dot dispersion obtained in Synthesis Examples 1 and 2 are respectively centrifuged to obtain precipitated surface modified quantum dots, and the surface modified quantum dots are respectively washed with hexane and then, centrifuged again and dried, obtaining surface modified green quantum dot powder and surface modified red quantum dot powder.

The obtained quantum dot powder is subjected to thermogravimetric analysis (TGA) by using differential scanning calorimetry (DSC) to obtain a thermogravimetric analysis graph. In each thermogravimetric analysis graph of the surface modified green quantum dot powder and the surface modified red quantum dot powder, a first peak between about 400° C. to 500° C. is confirmed, a second peak between about 200° C. to 300° C. is confirmed, and an area ratio of the first peak and the second peak is shown in Table 1.

TABLE 1

| | $A_1$ | $A_2$ | $A_1$:$A_2$ |
|---|---|---|---|
| Synthesis Example 1 | 58.91 | 192.93 | 0.305 |
| Synthesis Example 2 | 54.46 | 127.7 | 0.426 |

* $A_1$: Area of the first peak (between 400° C. to 500° C.) in the TGA graph
* $A_2$: Area of the second peak (between 200° C. to 300° C.) in the TGA graph

Preparation Example: Preparation of Curable Composition

Preparation Example 1

The surface modified green quantum dot (InP/ZnSe/ZnS core-shell quantum dot) dispersion obtained in Synthesis Example 1 is diluted with triethylene glycol dimethacrylate (Miwon Commercial Co., Ltd), and a polymerization inhibitor (methylhydroquinone, Tokyo Chemical Industry Co., Ltd.) is added thereto and then, stirred for 5 minutes. Subsequently, a photoinitiator (TPO-L, Polynetron Co., Ltd.) is added thereto, and scattering particles ($TiO_2$, SDT89, Iridos Co., Ltd.) are added thereto. The obtained entire dispersion is stirred for 1 hour, preparing a solvent-free curable composition. Based on a total amount of the solvent-free curable composition, the quantum dots are included in an amount of 48 wt %, the triethylene glycol dimethacrylate is included in an amount of 40 wt %, the polymerization inhibitor is included in an amount of 1 wt %, the photoinitiator is included in an amount of 3 wt %, and the scattering particles are included in an amount of 8 wt %.

Preparation Example 2

The surface modified red quantum dot (InP/ZnSe/ZnS core-shell quantum dot) dispersion according to Synthesis Example 2 is diluted with triethylene glycol dimethacrylate (Miwon Commercial Co., Ltd.), and a polymerization inhibitor (methylhydroquinone, Tokyo Chemical Industry Co., Ltd.) is added thereto and then, stirred for 5 minutes. Subsequently, a photoinitiator (TPO-L, Polynetron Co., Ltd.) is added thereto, and then, scattering particles ($TiO_2$, SDT89, Iridos Co., Ltd.) are added thereto. The obtained entire dispersion is stirred for 1 hour, preparing a solvent-free curable composition. Based on a total amount of the solvent-free curable composition, the quantum dots are used in an amount of 36 wt %, the triethylene glycol dimethacrylate is used in an amount of 52 wt %, the polymerization inhibitor is used in an amount of 1 wt %, the photoinitiator is used in an amount of 3 wt %, and scattering particles are used in an amount of 8 wt %.

Reference Preparation Example 1

A quaternary copolymer of methacrylic acid, benzyl methacrylate, hydroxyethyl methacrylate, and styrene (an acid value: 130 milligrams of potassium hydroxide per gram (mg KOH/g), a molecular weight: 8,000 grams per mole (g/mol)) are mixed in propylene glycol monomethyl ether acetate (PGMEA, a solvent) at a concentration of 30 wt % to prepare a binder solution. The binder solution is mixed with the non-surface-modified green quantum dot (InP/ZnSe/ZnS core-shell quantum dot) dispersion obtained in Step 2 of Synthesis Example 1, and hexaacrylate with the following structure as a photocurable monomer, glycol di-3-mercaptopropionate (hereinafter, "2T"), an oxime ester compound as a photoinitiator, scattering particles ($TiO_2$), and a solvent (PGMEA) are mixed therewith to prepare a curable composition.

The prepared curable composition includes 36 wt % of the quantum dots, 12.5 wt % of a binder polymer, 25 wt % of 2 T, 12 wt % of a photopolymerizable monomer, 0.5 wt % of a photoinitiator, and 10 wt % of scattering particles on a solid basis, wherein a total solid content is 25 wt %.

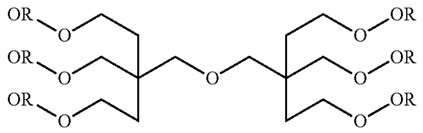

wherein

OR= 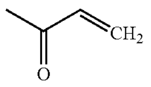

Example I: Formation of Quantum Dot-Polymer Pattern

Example 1

The curable composition according to Preparation Example 1 is spin-coated on a glass substrate at 150 revolutions per minute (rpm) for 5 seconds to form a film. The obtained film is heat-treated (prebaked) at 100° C. Subsequently, a mask with a predetermined pattern (e.g., square dots or stripe pattern) is disposed over the film and irradiated by UV light (365 nm, intensity: 100 millijoules (mJ)) for 1 second. After removing the mask, the film is developed with a potassium hydroxide aqueous solution (a concentration: 0.043%) for 50 seconds to obtain a quantum dot-polymer pattern with a thickness of about 10 micrometers (μm). The obtained quantum dot-polymer pattern is heat-treated (post-baked) at 180° C. for 30 minutes under a nitrogen atmosphere to form a quantum dot-polymer pattern.

Example 2

The curable composition according to Reference Preparation Example 1 is spin-coated on a glass substrate at 150 rpm for 5 seconds to form a film. The obtained film is placed in a vacuum oven (a pressure: $1\times10^{-3}$ Torr) for 100 seconds to volatilize the solvent. Subsequently, the film from in which the solvent is volatilized is heat-treated (prebaked) at 100° C. A mask with a predetermined pattern (e.g., square dots or stripe pattern) is disposed over the film and irradiated by UV light (365 nm, intensity: 100 mJ) for 1 hour. After removing the mask, the film is developed with a potassium hydroxide aqueous solution (a concentration: 0.043%) for 50 seconds to obtain a quantum dot-polymer pattern with a thickness of about 10 μm. The obtained quantum dot-polymer pattern is heat-treated (post-baked) at 180° C. for 30 minutes for a nitrogen atmosphere to form a quantum dot-polymer pattern.

Comparative Example 1

A quantum dot-polymer pattern is formed according to the same method as Example 1 except that the curable composition according to Reference Preparation Example 1 is used instead of the curable composition according to Preparation Example 1.

Comparative Example 2

A quantum dot-polymer pattern is formed according to the same method as Example 2 except that the volatilizing the solvent under the vacuum is omitted.

Evaluation II

The quantum dot-polymer patterns of Example 1 and Comparative Example 1 are subjected to thermogravimetric analysis (TGA) by using differential scanning calorimetry (DSC) to obtain thermogravimetric analysis graphs.

The thermogravimetric analysis graphs of the quantum dot-polymer patterns of Example 1 and Comparative Example 1 are confirmed to have a first peak at about 400° C. and a second peak between about 200° C. and 300° C., and an intensity ratio of the first peak and the second peak is shown in Table 2.

TABLE 2

| | $I_1$ | $I_2$ | $I_1$:$I_2$ |
|---|---|---|---|
| Example 1 | 546.89 | 53.77 | 10.17:1 |
| Comparative Example 1 | 532.11 | 79.45 | 6.69:1 |

* $I_1$: intensity of the first peak in the TGA graph
* $I_2$: intensity of the second peak in the TGA graph

Evaluation III

The upper surfaces of the quantum dot-polymer patterns of Examples 1 and 2 and Comparative Example 1 are evaluated with respect to surface roughness.

The surface roughness is evaluated from an average flatness of an area of 600 μm×600 μm by using a three-dimensional optical microscope.

Figure 3:
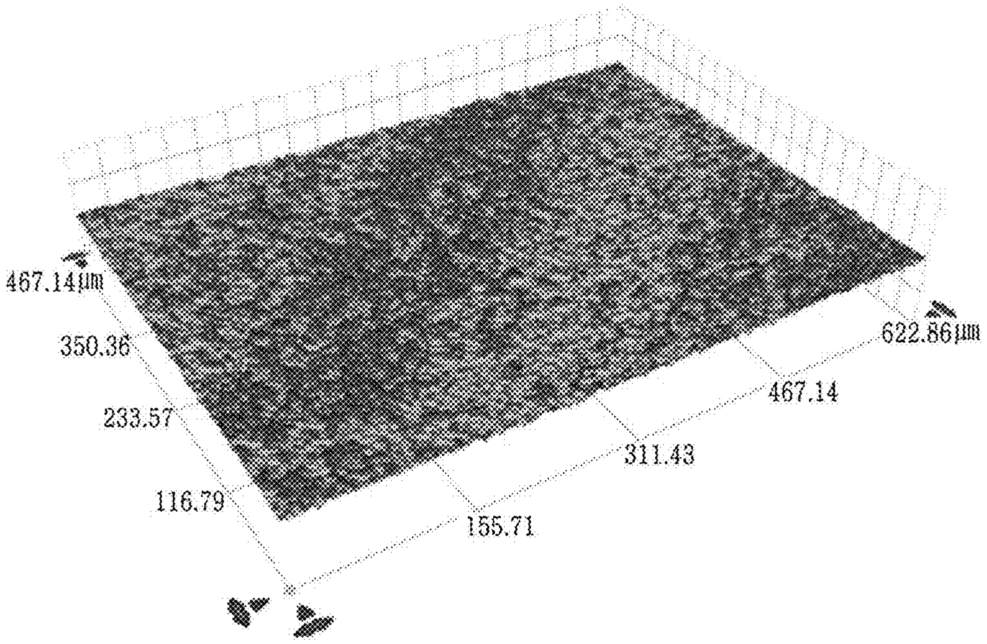
FIG. 3 is an optical micrograph showing a flatness of the upper surface of the solvent-free quantum dot-polymer pattern of Example 1.
Figure 4:
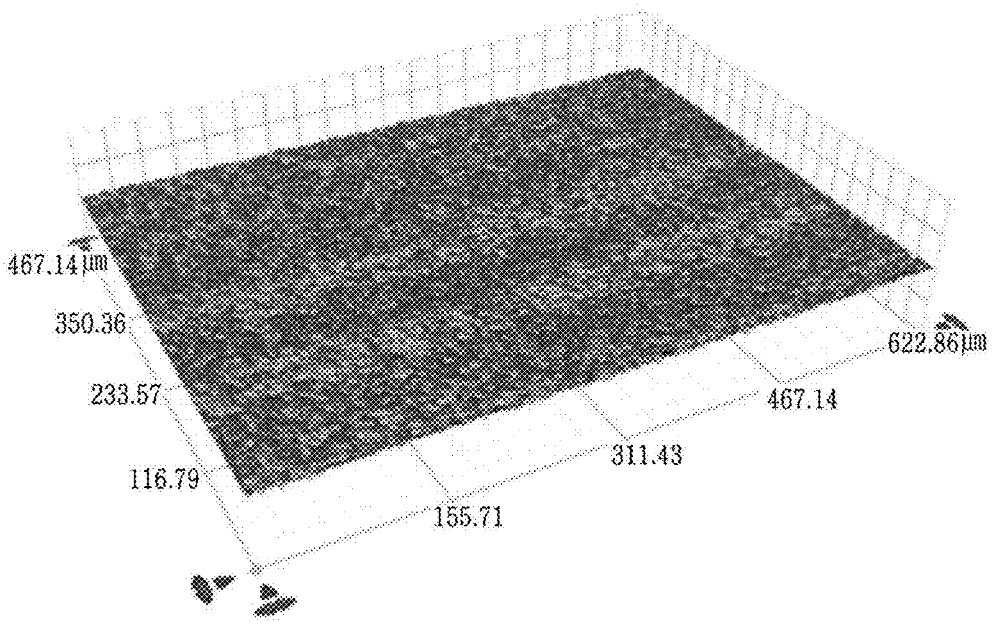
FIG. 4 is an optical micrograph showing a flatness of the upper surface of the vacuum-treated solvent-based quantum dot-polymer pattern of Example 2.
Figure 5:
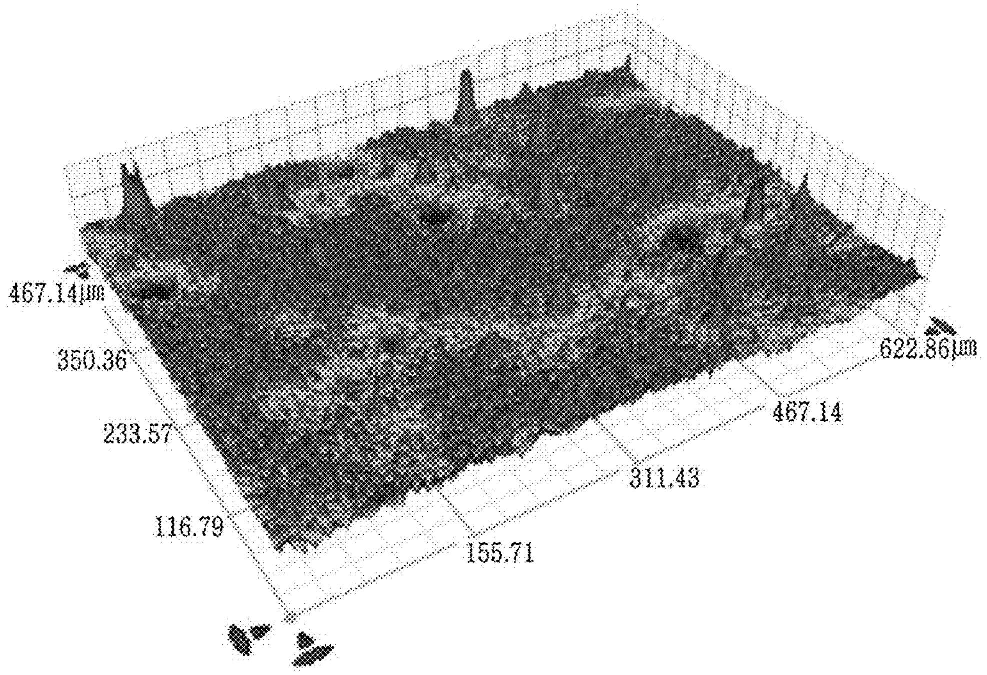
FIG. 5 is an optical micrograph showing a flatness of the upper surface of the solvent-based quantum dot-polymer pattern of Comparative Example 1.

The results are shown in FIGS. 3 to 5 and Table 3.

FIG. 3 is an optical micrograph showing a flatness of the upper surface of the quantum dot-polymer pattern of Example 1, FIG. 4 is an optical micrograph showing a flatness of the upper surface of the quantum dot-polymer pattern of Example 2, and FIG. 5 is an optical micrograph showing a flatness of the upper surface of the quantum dot-polymer pattern of Comparative Example 1.

TABLE 3

| | Example 1 | Example 2 | Comparative Example 1 |
|---|---|---|---|
| $R_a$ | 6.20 nm | 5.86 nm | 14.06 nm |
| $R_p$ | 34.06 nm | 123.10 nm | 571.91 nm |
| $R_v$ | 35.37 nm | 41.29 nm | 99.13 nm |

* $R_a$: average roughness
* $R_p$: maximum profile peak height
* $R_v$: maximum profile valley depth Referring to FIGS. 3 to 5 and Table 3, the quantum dot-polymer patterns of Examples 1 and 2 exhibit relatively low surface roughness and a relatively high flatness, compared with the quantum dot-polymer pattern of Comparative Example 1. Accordingly, the quantum dot-polymer patterns of Examples 1 and 2, formed from the solvent-free curable composition and the solvent-containing curable composition with additional solvent-removing process before the thermal process and the optical process, respectively, prevent or reduce deformation of pattern profiles due to volatilization of the solvent, and thus have a high flatness.

Example II: Formation of Encapsulation Film

Example 3

A silicon nitride is vacuum-deposited on the quantum dot-polymer pattern of Example 1 at 160° C. to form a 300 nm-thick lower encapsulation film and then aluminum oxide is vacuum-deposited thereon at 160° C. to form a 100 nm-thick upper encapsulation film, manufacturing the encapsulated quantum dot-polymer pattern.

Example 4

An encapsulated quantum dot-polymer pattern is formed according to the same method as Example 3 except that the quantum dot-polymer pattern of Example 2 is used instead of the quantum dot-polymer pattern of Example 1.

Comparative Example 3

An encapsulated quantum dot-polymer pattern is formed according to the same method as Example 3 except that the quantum dot-polymer pattern of Comparative Example 1 is used instead of the quantum dot-polymer pattern of Example 1.

Comparative Example 4

An encapsulated quantum dot-polymer pattern is formed according to the same method as Example 3 except that the quantum dot-polymer pattern of Comparative Example 2 is used instead of the quantum dot-polymer pattern of Example 1.

Evaluation IV

The encapsulated quantum dot-polymer patterns of Example 3 and Comparative Example 3 are evaluated with respect to luminance changes for 500 hours, while irradiated by a light source (a wavelength: 450 nm, 130 milliwatts per square centimeter (mW/cm$^2$)) with 70,000 nit at 60° C. in the air.

Figure 6:
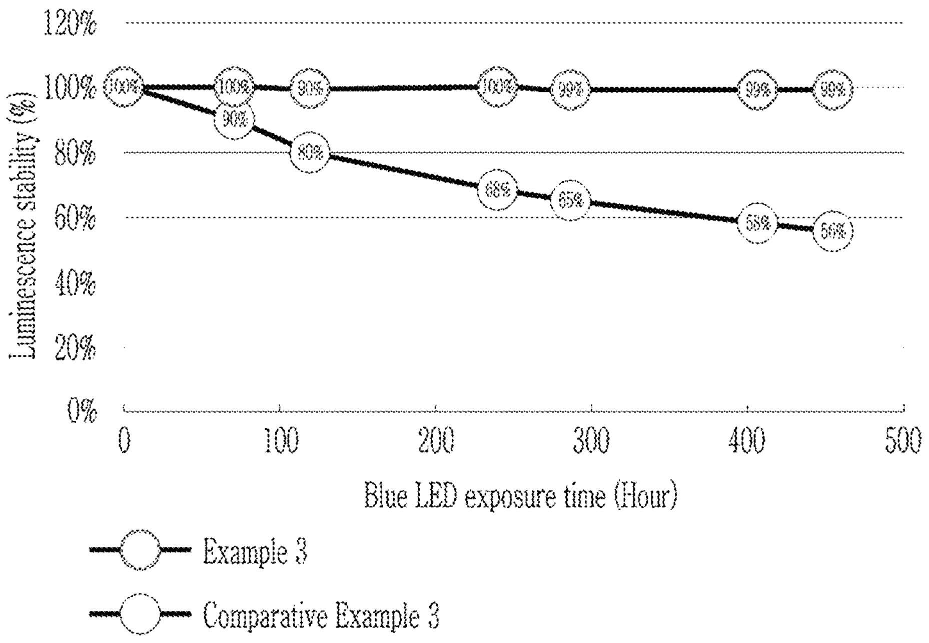
FIG. 6 is a graph of Luminescence stability (percent (%)) versus Blue light emitting diode (LED) exposure time (Hour) showing a luminance change of the encapsulated quantum dot-polymer patterns of Example 3 and Comparative Example 3.

The results are shown in FIG. 6.

FIG. 6 is a graph showing a luminance change of the encapsulated quantum dot-polymer patterns of Example 3 and Comparative Example 3.

Referring to FIG. 6, the encapsulated quantum dot-polymer pattern of Example 3 exhibits a very small luminance change of about 1% for about 500 hours, while the encapsulated quantum dot-polymer pattern of Comparative Example 3 exhibits a large luminance change of greater than or equal to about 44% for about 500 hours. Accordingly, the encapsulated quantum dot-polymer pattern of Example 3 exhibits relatively high reliability, compared with the encapsulated quantum dot-polymer pattern of Comparative Example 3.

Evaluation V

The encapsulated quantum dot-polymer patterns of Example 4 and Comparative Example 4 are evaluated with respect to a luminance change for 300 hours, while irradiated for 350 hours by a light source (a wavelength: 450 nm, 130 mW/cm$^2$) with 70,000 nit at 60° C. in the air.

Figure 7:
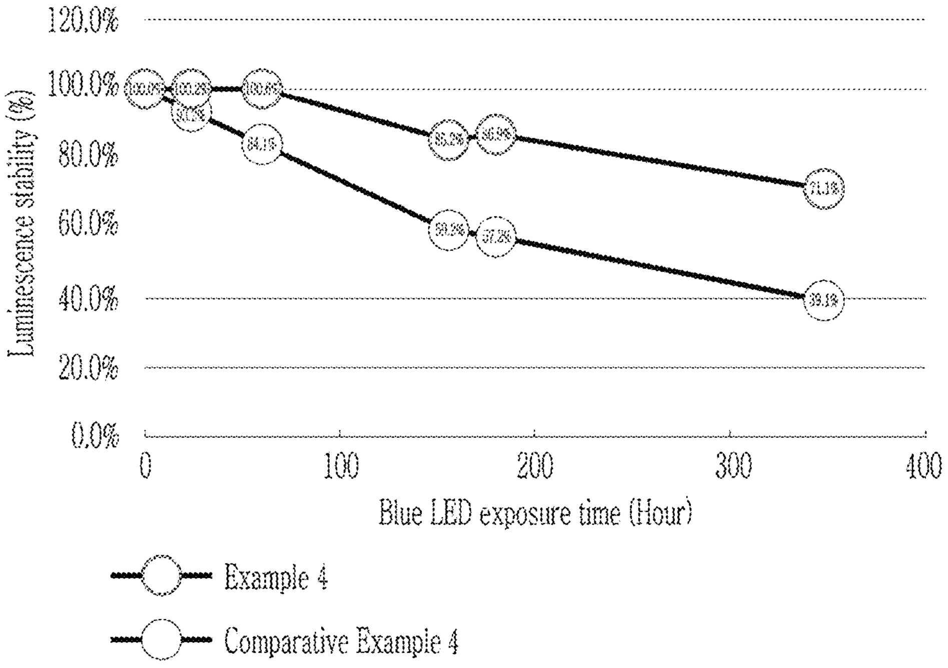
FIG. 7 is a graph of Luminescence stability (%) versus Blue LED exposure time (Hour) showing a luminance change of the encapsulated quantum dot-polymer patterns of Example 4 and Comparative Example 4.

The results are shown in FIG. 7.

FIG. 7 is a graph showing a luminance change of the encapsulated quantum dot-polymer patterns of Example 4 and Comparative Example 4.

Referring to FIG. 7, the encapsulated quantum dot-polymer pattern of Example 4 exhibits a relatively low, e.g., small, luminance change, compared with the encapsulated quantum dot-polymer pattern of Comparative Example 4. Accordingly, the encapsulated quantum dot-polymer pattern of Example 4 exhibits relatively high reliability, compared with the encapsulated quantum dot-polymer pattern of Comparative Example 4.

While this disclosure has been described in connection with what is presently considered to be practical example embodiments, it is to be understood that the invention is not limited to the disclosed embodiments. On the contrary, it is intended to cover various modifications and equivalent arrangements included within the spirit and scope of the appended claims.

What is claimed is:

1. A display panel, comprising a light emitting device array, the light emitting device array comprising a plurality of light emitting devices, a color conversion layer on the light emitting device array, the color conversion layer being configured to convert the emission spectrum of light emitted from the light emitting device array, and an encapsulation film on the color conversion layer, wherein the color conversion layer comprises a quantum dot-polymer pattern comprising a quantum dot-polymer composite, and an average roughness of an upper surface of the quantum dot-polymer pattern is less than or equal to about 3% of a thickness of the encapsulation film.

2. The display panel of claim 1, wherein a thickness of the quantum dot-polymer pattern is about 10 times to about 1,000 times a thickness of the encapsulation film, and the average roughness of the upper surface of the quantum dot-polymer pattern is less than about 0.5% of the thickness of the quantum dot-polymer pattern.

3. The display panel of claim 1, wherein the color conversion layer further comprises partition walls, the partition walls defining a plurality of regions and surrounding each quantum dot-polymer pattern in each region, wherein the encapsulation film is in contact with an upper surface of the quantum dot- polymer pattern and an upper surface of the partition wall.

4. The display panel of claim 3, wherein the upper surface of the quantum dot-polymer pattern is flat.

5. The display panel of claim 4, wherein the quantum dot-polymer pattern comprises an edge portion in contact with the partition wall, and a central portion surrounded by the edge portion of the quantum dot-polymer pattern, wherein a difference between a thickness of the edge portion of the quantum dot-polymer pattern and a thickness of the central portion of the quantum dot-polymer pattern is less than about 1% of the thickness of the edge portion of the quantum dot-polymer pattern.

6. The display panel of claim 1, wherein a maximum profile peak height of the roughness profile of the upper surface of the quantum dot-polymer pattern is less than the thickness of the encapsulation film.

7. The display panel of claim 6, wherein the maximum profile peak height of the roughness profile of the upper surface of the quantum dot-polymer pattern is about 0.1% to about 50% of the thickness of the encapsulation film.

8. The display panel of claim 6, wherein the maximum profile peak height of the roughness profile of the upper surface of the quantum dot-polymer pattern is about 2 nanometers to about 200 nanometers.

9. The display panel of claim 1, wherein the quantum dot-polymer pattern does not comprise a solvent.

10. The display panel of claim 1, wherein a thermogravimetric analysis graph measured by differential scanning calorimetry of the quantum dot-polymer pattern comprises a first peak between about 350° C. and about 450° C. and a second peak between about 200° C. and about 300° C., and the intensity of the first peak is about 8 times to about 20 times the intensity of the second peak.

11. The display panel of claim 1, wherein the average roughness of the upper surface of the quantum dot-polymer pattern is about 1 nanometers to about 12 nanometers.

12. The display panel of claim 11, wherein a maximum profile peak height and a maximum profile valley depth of the roughness profile of the upper surface of the quantum dot-polymer pattern are each about 2 nanometers to about 200 nanometers.

13. The display panel of claim 1, wherein the light emitting device is configured to emit light of a first emission spectrum, the color conversion layer comprises a first color conversion region configured to convert light of the first emission spectrum into light of a second emission spectrum, a second color conversion region configured to convert light of the first emission spectrum into light of a third emission spectrum, and a light-transmitting region configured to transmit light of the first emission spectrum, the quantum dot-polymer pattern in the first color conversion region comprises first quantum dots configured to emit light of the second emission spectrum, the quantum dot-polymer pattern in the second color conversion region comprises a second quantum dot configured to emit light of the third emission spectrum, the first emission spectrum, the second emission spectrum, and the third emission spectrum are different from each other, and the second emission spectrum and the third emission spectrum each comprise a longer wavelength than the first emission spectrum.

14. The display panel of claim 1, wherein the light emitting device comprises an organic light emitting diode, an inorganic light emitting diode, a quantum dot light emitting diode, a perovskite light emitting diode, a micro light emitting diode, a nano light emitting diode, or a combination thereof.

15. The display panel of claim 1, wherein the encapsulation film comprises an inorganic material, an organic-inorganic material, or a combination thereof, and an organic film between the color conversion layer and the encapsulation film is not present.

16. The display panel of claim 1, further comprising a color filter layer disposed on the encapsulation film.

17. An electronic device comprising the display panel of claim 1.

18. A method of manufacturing the display panel of claim 1, the method comprising forming the color conversion layer on the light emitting device array comprising the plurality of light emitting devices, and forming the encapsulation film on the color conversion layer, wherein the forming of the color conversion layer comprises forming a partition wall to define a plurality of regions, and forming the quantum dot-polymer pattern comprising the quantum dot-polymer composite in at least a portion of the plurality of regions to manufacture the display panel.

19. The method of claim 18, wherein the forming of the quantum dot polymer pattern comprises preparing a solvent-free curable composition comprising quantum dots and a curable monomer, applying the solvent-free curable composition to the plurality of regions, and exposing the solvent-free curable composition applied to the plurality of regions to light to form the quantum dot-polymer pattern comprising the quantum dot-polymer composite in some of the plurality of regions, and the quantum dots comprise two or more organic ligands that are thermally decomposable at different temperatures.

20. The method of claim 19, wherein the organic ligand comprises a first organic ligand in which a moiety bonding to the surface of the quantum dot is a carboxyl group, and a second organic ligand in which a moiety bonding to the surface of the quantum dot is a thiol group; or thermogravimetric analysis graph measured by differential scanning calorimetry of the quantum dots comprises a first peak between about 400° C. and about 500° C. and a second peak between 200° C. and about 300° C., and an area of the first peak is about 0.16 times to about 0.5 times the area of the second peak.

21. The method of claim 18, wherein the forming of the quantum dot-polymer pattern comprises preparing a composition comprising quantum dot, a curable monomer, and a solvent, applying the composition to the plurality of regions, removing the solvent in the composition applied to the plurality of regions under vacuum, heat-treating the composition applied to the plurality of regions, and exposing the composition applied to the plurality of regions to light to form the quantum dot-polymer pattern in some of the plurality of regions, the quantum dot-polymer pattern comprising a quantum dot-polymer composite.

22. The display panel of claim 1, wherein the thickness of the quantum dot- polymer pattern is about 200 times to about 1,000 times the thickness of the encapsulation film.

23. The display panel of claim 1, wherein the encapsulation film seals the upper surface of the quantum dot-polymer pattern.

* * * * *